US009706419B2

(12) United States Patent
Bozier et al.

(10) Patent No.: US 9,706,419 B2
(45) Date of Patent: Jul. 11, 2017

(54) ANTENNA APPARATUS AND METHOD OF PERFORMING SPATIAL NULLING WITHIN THE ANTENNA APPARATUS

(71) Applicant: Airspan Networks Inc., Boca Raton, FL (US)

(72) Inventors: Michele Frances Bozier, Amersham (GB); Krzysztof Dudzinski, Langley (GB); Martin Lysejko, Bagshot (GB)

(73) Assignee: AIRSPAN NETWORKS INC., Boca Raton, FL (US)

( * ) Notice: Subject to any disclaimer, the term of this patent is extended or adjusted under 35 U.S.C. 154(b) by 0 days.

(21) Appl. No.: 15/186,134

(22) Filed: Jun. 17, 2016

(65) Prior Publication Data

US 2016/0380354 A1    Dec. 29, 2016

(30) Foreign Application Priority Data

Jun. 25, 2015  (GB) .................................. 1511200.6
Oct. 30, 2015  (GB) .................................. 1519237.0

(51) Int. Cl.
*H04W 4/00* (2009.01)
*H04W 24/02* (2009.01)
(Continued)

(52) U.S. Cl.
CPC ............ *H04W 24/02* (2013.01); *F16M 11/06* (2013.01); *G01S 3/043* (2013.01); *G01S 3/14* (2013.01);
(Continued)

(58) Field of Classification Search
USPC .. 455/69, 179.1, 182.3, 183.1, 184.1, 185.1, 455/562.1
See application file for complete search history.

(56) References Cited

U.S. PATENT DOCUMENTS 4,599,620 A    7/1986  Evans
4,633,256 A    12/1986 Chadwick
(Continued)

FOREIGN PATENT DOCUMENTS

CN       1284794 A      2/2001
CN     104635203 A      5/2015
(Continued)

OTHER PUBLICATIONS

UK Search Report from GB 1514938.8, Apr. 18, 2016, 4 pgs.
(Continued)

*Primary Examiner* — Fayyaz Alam
(74) *Attorney, Agent, or Firm* — Haynes Beffel & Wolfeld LLP

(57) ABSTRACT

An antenna apparatus operates as a base station in a wireless network with spatial nulling performed within such apparatus. The apparatus has an antenna assembly employing a selected reception beam pattern. During a nulling test, a reception beam pattern controller causes the assembly to employ each reception beam pattern. Quality metric determination circuitry determines for each reception beam pattern a link quality metric for each of several wireless terminals, based on communication between those wireless terminals and the base station while the assembly employs that reception beam pattern. Reception beam determination circuitry determines, from the various link quality metrics, a reception beam pattern from the reception beam patterns for use for subsequent communication with the wireless terminals. A reception beam pattern can be altered seeking to reduce interference source effects and to maintain an appropriate level of link quality regarding each wireless terminal communicating with the base station.

20 Claims, 22 Drawing Sheets

(51) Int. Cl.

| | | |
|---|---|---|
| G01S 19/53 | (2010.01) | |
| G01S 3/14 | (2006.01) | |
| G01S 5/02 | (2010.01) | |
| H01Q 1/02 | (2006.01) | |
| H01Q 3/04 | (2006.01) | |
| H01Q 3/24 | (2006.01) | |
| H01Q 3/26 | (2006.01) | |
| H01Q 21/06 | (2006.01) | |
| H01Q 21/08 | (2006.01) | |
| H01Q 21/20 | (2006.01) | |
| H01Q 21/28 | (2006.01) | |
| H01Q 25/00 | (2006.01) | |
| H04B 7/06 | (2006.01) | |
| H04W 28/02 | (2009.01) | |
| H04W 88/04 | (2009.01) | |
| H05K 7/20 | (2006.01) | |
| H04L 12/24 | (2006.01) | |
| H04L 29/08 | (2006.01) | |
| H04W 16/28 | (2009.01) | |
| H04W 40/22 | (2009.01) | |
| H04W 72/08 | (2009.01) | |
| H04W 24/10 | (2009.01) | |
| H01Q 1/24 | (2006.01) | |
| H01Q 1/50 | (2006.01) | |
| H01Q 3/10 | (2006.01) | |
| H04W 72/04 | (2009.01) | |
| G01S 3/04 | (2006.01) | |
| G01S 19/24 | (2010.01) | |
| H01Q 1/36 | (2006.01) | |
| H01Q 1/42 | (2006.01) | |
| H01Q 3/12 | (2006.01) | |
| H01Q 21/00 | (2006.01) | |
| H01Q 1/12 | (2006.01) | |
| H01Q 3/02 | (2006.01) | |
| H01Q 3/36 | (2006.01) | |
| H01Q 21/24 | (2006.01) | |
| H04B 7/0456 | (2017.01) | |
| F16M 11/06 | (2006.01) | |
| H04L 12/26 | (2006.01) | |
| H04W 24/08 | (2009.01) | |
| H04W 28/24 | (2009.01) | |
| H04W 48/06 | (2009.01) | |
| H04B 7/08 | (2006.01) | |
| H04W 84/04 | (2009.01) | |
| H04W 84/02 | (2009.01) | |
| H04W 88/08 | (2009.01) | |

(52) U.S. Cl.
CPC ............ *G01S 5/0247* (2013.01); *G01S 19/24* (2013.01); *G01S 19/53* (2013.01); *H01Q 1/02* (2013.01); *H01Q 1/1207* (2013.01); *H01Q 1/1228* (2013.01); *H01Q 1/246* (2013.01); *H01Q 1/36* (2013.01); *H01Q 1/42* (2013.01); *H01Q 1/50* (2013.01); *H01Q 3/02* (2013.01); *H01Q 3/04* (2013.01); *H01Q 3/10* (2013.01); *H01Q 3/12* (2013.01); *H01Q 3/24* (2013.01); *H01Q 3/26* (2013.01); *H01Q 3/2611* (2013.01); *H01Q 3/36* (2013.01); *H01Q 21/00* (2013.01); *H01Q 21/065* (2013.01); *H01Q 21/08* (2013.01); *H01Q 21/205* (2013.01); *H01Q 21/24* (2013.01); *H01Q 21/28* (2013.01); *H01Q 25/002* (2013.01); *H01Q 25/005* (2013.01); *H04B 7/0456* (2013.01); *H04B 7/0617* (2013.01); *H04B 7/0621* (2013.01); *H04B 7/0691* (2013.01); *H04B 7/0695* (2013.01); *H04B 7/086* (2013.01); *H04B 7/088* (2013.01); *H04B 7/0874* (2013.01); *H04L 41/0806* (2013.01); *H04L 41/0816* (2013.01); *H04L 43/0829* (2013.01); *H04L 67/18* (2013.01); *H04L 67/34* (2013.01); *H04W 4/001* (2013.01); *H04W 16/28* (2013.01); *H04W 24/08* (2013.01); *H04W 24/10* (2013.01); *H04W 28/0236* (2013.01); *H04W 28/0268* (2013.01); *H04W 28/0284* (2013.01); *H04W 28/24* (2013.01); *H04W 40/22* (2013.01); *H04W 48/06* (2013.01); *H04W 72/042* (2013.01); *H04W 72/085* (2013.01); *H04W 88/04* (2013.01); *H05K 7/20* (2013.01); *H04B 7/0817* (2013.01); *H04W 84/02* (2013.01); *H04W 84/045* (2013.01); *H04W 88/08* (2013.01)

(56) References Cited

U.S. PATENT DOCUMENTS

| | | |
|---|---|---|
| 4,959,653 A | 9/1990 | Ganz |
| 6,124,832 A | 9/2000 | Jeon et al. |
| 6,404,385 B1 | 6/2002 | Croq et al. |
| 6,486,832 B1 | 11/2002 | Abramov et al. |
| 6,522,898 B1 | 2/2003 | Kohno et al. |
| 6,621,454 B1 | 9/2003 | Reudink et al. |
| 6,934,511 B1 | 8/2005 | Lovinggood et al. |
| 7,593,693 B1 | 9/2009 | Kasapi et al. |
| 8,577,416 B2* | 11/2013 | Nandagopalan ......... H01Q 3/30 455/562.1 |
| 8,630,267 B1 | 1/2014 | Jin |
| 2002/0042274 A1 | 4/2002 | Ades |
| 2003/0195017 A1* | 10/2003 | Chen ..................... H01Q 1/246 455/562.1 |
| 2003/0228857 A1 | 12/2003 | Maeki |
| 2004/0233103 A1 | 11/2004 | Toshev |
| 2004/0242274 A1 | 12/2004 | Corbett et al. |
| 2005/0048921 A1 | 3/2005 | Chung |
| 2005/0063340 A1 | 3/2005 | Hoffmann et al. |
| 2005/0157684 A1 | 7/2005 | Ylitalo et al. |
| 2005/0285784 A1 | 12/2005 | Chiang et al. |
| 2006/0292991 A1 | 12/2006 | Abramov et al. |
| 2008/0005121 A1* | 1/2008 | Lam ................. G06F 17/30067 |
| 2009/0005121 A1* | 1/2009 | Wong ..................... H01Q 1/246 455/562.1 |
| 2009/0207077 A1* | 8/2009 | Hwang ..................... H01Q 3/40 342/374 |
| 2010/0071049 A1 | 3/2010 | Bahr et al. |
| 2011/0235569 A1 | 9/2011 | Huang et al. |
| 2011/0244808 A1 | 10/2011 | Shiotsuki et al. |
| 2012/0119951 A1 | 5/2012 | Vollath |
| 2013/0215844 A1 | 8/2013 | Seol et al. |
| 2014/0256376 A1 | 9/2014 | Weissman et al. |
| 2015/0078191 A1 | 3/2015 | Jongren et al. |

FOREIGN PATENT DOCUMENTS

| | | |
|---|---|---|
| EP | 0654915 A2 | 5/1995 |
| EP | 1903348 A1 | 3/2008 |
| EP | 2207267 A2 | 7/2010 |
| EP | 2391157 A2 | 11/2011 |
| EP | 2448144 A1 | 5/2012 |
| EP | 2506625 A1 | 10/2012 |
| EP | 2538712 A1 | 12/2012 |
| GB | 2318914 A | 5/1998 |
| GB | 2484377 A | 4/2012 |
| JP | H05188128 A | 7/1993 |
| JP | H06188802 A | 7/1994 |
| KR | 101346062 B1 | 12/2013 |
| WO | 9426001 A1 | 11/1994 |
| WO | 9965105 A1 | 12/1999 |
| WO | 0152447 A2 | 7/2001 |
| WO | 0231908 A2 | 4/2002 |
| WO | 2004095764 A2 | 11/2004 |

(56) References Cited

FOREIGN PATENT DOCUMENTS

| WO | 2004114546 A1 | 12/2004 |
|---|---|---|
| WO | 2007010274 A1 | 1/2007 |
| WO | 2007069809 A1 | 6/2007 |
| WO | 2008111882 A1 | 9/2008 |
| WO | 2008151057 A2 | 12/2008 |
| WO | 2010077790 A1 | 7/2010 |
| WO | 2011060058 A1 | 5/2011 |
| WO | 2014106539 A1 | 7/2014 |

OTHER PUBLICATIONS

UK Search Report from GB 1516901.4, Mar. 18, 2016, 5 pgs.
UK Search Report from GB 1518654.7, Mar. 24, 2016, 3 pgs.
UK Search Report from GB 1519216.4, Apr. 15, 2016, 5 pgs.
UK Search Report from GB 1519220.6, Apr. 4, 2016, 4 pgs.
UK Search Report from GB 1519228.9, Apr. 29, 2016, 4 pgs.
UK Search Report from GB 1519270.1, Apr. 25, 2016, 5 pgs.
UK Search Report from GB 1519272.7, Jun. 10, 2016, 3 pgs.
UK Search Report from GB 1519273.5, Apr. 27, 2016, 3 pgs.
Doi et al., "Low-Cost Antenna Array Via Antenna Switching for High Resolution 2-D DOA Estimation," SIPS 2013 Proc. IEEE, Oct. 16, 2013, pp. 83-88.
Jung et al., "Attitude Sensing Using a GPS Antenna on a Turntable: Experimental Tests," Navigation, J. of the Institute of Navigation, Fairfax, VA, US, vol. 51, No. 3, Dec. 1, 2004, pp. 221-230.
PCT Search Report from PCT/GB2016/051234 (corresponding to U.S. Appl. No. 15/187,570), Aug. 5, 2016, 13 pgs.
PCT Search Report from PCT/GB2016/051360 (corresponding to U.S. Appl. No. 15/187,900), Aug. 19, 2016, 12 pgs.
PCT Search Report from PCT/GB2016/051615 (corresponding to U.S. Appl. No. 15/187,515), Aug. 12, 2016, 13 pgs.
PCT Search Report from PCT/GB2016/051617 (corresponding to U.S. Appl. No. 15/187,616), Aug. 23, 2016, 11 pgs.
PCT Search Report from PCT/GB2016/051618 (corresponding to U.S. Appl. No. 15/187,602), Aug. 12, 2016, 12 pgs.
PCT Search Report from PCT/GB2016/051759 (corresponding to U.S. Appl. No. 15/187,680), Sep. 14, 2016, 15 pgs.
PCT Search Report from PCT/GB2016/051285, Jul. 13, 2016, 12 pgs.
UK Search Report from GB 1519237.0, Jun. 10 Apr. 2016, 3 pgs.
PCT Search Report from PCT/GB2016/051195, Jul. 25, 2016, 13 pgs.
PCT Search Report from PCT/GB2016/051205, Jul. 25, 2016, 13 pgs.

* cited by examiner

FT2 (AND POSSIBLY FT1) MAY SEE INTERFERENCE SOURCE 1
FB MAY SEE INTERFERENCE SOURCE 2

ANTENNA APPARATUS AND METHOD OF PERFORMING SPATIAL NULLING WITHIN THE ANTENNA APPARATUS

CROSS-REFERENCE TO OTHER APPLICATIONS

This application claims priority under 35 U.S.C. 119(b) to UK Application No. 1511200.6, filed 25 Jun. 2015 and entitled "STEERABLE ANTENNA SYSTEM", and to UK Application No. 1519237.0, filed 30 Oct. 2015 and entitled "AN ANTENNA APPARATUS AND METHOD OF PERFORMING SPATIAL NULLING WITHIN THE ANTENNA APPARATUS". Both applications are incorporated by reference herein.

BACKGROUND

The present technique relates to an antenna apparatus that may be used as a base station in a wireless network, and to a method of performing spatial nulling within such an antenna apparatus.

A wireless network may be provided to serve a range of different functions, but typically includes a number of base stations, with each base station communicating wirelessly with multiple wireless terminals. For instance, in the example of an access wireless network, the wireless terminals may be items of end user equipment, and each base station may communicate wirelessly with multiple such items of end user equipment. Another example of a wireless network is a wireless backhaul network (also referred to herein as a wireless feeder network), where each wireless terminal (also referred to herein as a feeder terminal) is typically coupled to an access point of an access network, and those wireless terminals then communicate wirelessly with one or more base stations, also referred to herein as feeder base stations. The feeder base stations are then used to connect the wireless backhaul network to a core network.

Within a wireless network, a base station will typically need to use a reception beam that facilitates receiving communication from a number of different wireless terminals. The quality of the link provided between the base station and the various wireless terminals can be affected by a number of factors, one of which is interference occurring from interference sources.

When the interference sources are static, steps may be taken to reconfigure the wireless network such that the effects of the interference source are reduced. This may for example involve determining which base stations particular wireless terminals should communicate with.

However, when the interference sources are more dynamic, for example due to an interference source moving through the geographical area covered by the wireless network, it may not be appropriate to invoke the steps necessary to reconfigure the wireless network, given the transient nature of the interference source. Nevertheless, such transient interference sources can still give rise to significant degradation in the link quality of the wireless links established between a particular base station and a plurality of wireless terminals. This can be particularly problematic for the reception beam utilised at the base station, which may practically have to be a relatively wide beam in order to allow communications to be received from multiple wireless terminals.

It would be desirable to provide an improved mechanism for reducing the effects of interference sources within a wireless network.

SUMMARY

In one example embodiment, there is provided an antenna apparatus for operating as a base station in a wireless network, comprising: an antenna assembly to employ a reception beam pattern selected from a plurality of reception beam patterns; a reception beam pattern controller to cause the antenna assembly to employ each of said plurality of reception beam patterns during a nulling test operation; quality metric determination circuitry to determine, for each reception beam pattern employed during said nulling test operation, a link quality metric for each of a plurality of wireless terminals based on communication between the plurality of wireless terminals and the base station whilst the antenna assembly is employing that reception beam pattern; and reception beam determination circuitry to determine, from the link quality metrics determined for the plurality of wireless terminals for each of the plurality of reception beam patterns, a reception beam pattern from said plurality of reception beam patterns to be used for a subsequent communication with the plurality of wireless terminals.

In accordance with the above embodiment, the antenna apparatus has an antenna assembly that is capable of employing a variety of different reception beam patterns. During a nulling test operation, that antenna assembly is controlled so that it employs different reception beam patterns at different points during the nulling test operation, so that during the nulling test operation multiple reception beam patterns are tested. For each reception beam pattern used during the nulling test operation, a link quality metric is determined for each of multiple wireless terminals that are arranged to communicate with the base station. Reception beam determination circuitry is then used to analyse the various link quality metrics in order to determine a reception beam pattern to be used for subsequent communication with the plurality of wireless terminals.

In the presence of an interference source within the wireless network, the link quality of the links established between the wireless terminals and the base station can be degraded. This can be particularly problematic for the receiver within the base station, which may ideally adopt a relatively wide beam pattern in its reception beam in order to allow communication from a variety of differently located wireless terminals, where the relatively wide nature of the beam is likely to increase the susceptibility to adverse effects from interference sources.

The variety of reception beam patterns available to the antenna assembly will typically include beam patterns that have reduced sensitivity in certain directions, which can enable attenuation of unwanted signals emanating from such directions, by effectively forming nulls (i.e. minima in the gain) in the spatial response pattern for those directions. In accordance with the above described technique, the reception beam determination circuitry attempts to achieve such spatial nulling in respect of interference sources while retaining a desired level of link quality for each of the various wireless terminals that need to communicate with the base station.

There are a number of different scenarios that may be used to trigger the nulling test operation. For example, in one embodiment the nulling test operation could effectively be operating continuously in the background, by effectively repeating the nulling test operation such that each time a reception beam pattern is selected based on completion of a current nulling test operation, the next nulling test operation is then started. Alternatively, the nulling test operation may be triggered at discrete points in time, for example at certain scheduled times, or in response to user action. It could also be triggered based on observation of a degradation in a particular quality metric measured within the wireless network, such as when the amount of noise observed on one or more links between the wireless terminals and the base station increases above a threshold level.

In one embodiment, each of the wireless terminals may be viewed equally when assessing a suitable reception beam pattern to select. However, in an alternative embodiment the reception beam determination circuitry is arranged to receive weighting information associated with at least one wireless terminal, and is arranged to utilise the weighting information in combination with the link quality metrics when determining the reception beam pattern to be used for the subsequent communication. This effectively enables some wireless terminals to be prioritised over others, so that it can be ensured that any reception beam pattern chosen meets certain predetermined requirements in terms of link quality for those prioritised wireless terminals. In one embodiment, the weighting information may be specified for each of the wireless terminals, and could for example be expressed as a relative weighting of each wireless terminal relative to the other wireless terminals.

The weighting information can take a variety of forms, but in one embodiment is an indication of a level of service to be provided to at least one of the wireless terminals. Such level of service indications may be expressed in terms of Quality of Service (QoS) levels for the various wireless terminals.

There are a number of ways in which the reception beam determination circuitry can analyse the various link quality metrics in order to determine a suitable reception beam pattern to be used for subsequent communication with the plurality of wireless terminals. However, in one embodiment the reception beam determination circuitry is configured to perform a harmonic mean operation using as inputs the link quality metrics determined for the plurality of wireless terminals for each of the plurality of reception beam patterns, in order to determine the reception beam pattern to be used for the subsequent communication. It has been found that by performing a harmonic mean operation based on the determined link quality metrics, this enables effective spatial nulling of interference sources to be achieved whilst maintaining suitable levels of link quality in the reception path for each of the various wireless terminals.

In embodiments where weighting information is also provided for one or more wireless terminals, the harmonic mean operation may take the form of a weighted harmonic mean operation, hence enabling the relative link quality requirements for the various wireless terminals to be taken into account when choosing a suitable reception beam pattern to seek to reduce the adverse effects of interference sources.

The link quality metric can take a variety of forms but in one embodiment is a throughput indication for the associated wireless terminal. The throughput indication can take a variety of forms, but in one example is a spectral efficiency value calculated for a link. Such throughput indications can be calculated from a variety of different measured properties, but in one embodiment are calculated from signal to noise ratio measurements, for example a CINR (Carrier to Interference plus Noise Ratio) measurement.

The nulling test operation can be arranged to terminate in a variety of ways. In one embodiment, the nulling test operation is continued until communication is observed by the base station from each of the plurality of wireless terminals for each of the plurality of reception beam patterns. Hence, the aim is to establish a full set of link quality metrics for each wireless terminal and each reception beam pattern.

In one embodiment, during the nulling test operation, each of the wireless terminals may be scheduled to communicate with the base station during the period in which each reception beam pattern is employed. If the actions of the wireless terminals can be controlled to this extent, then in one embodiment it may be necessary to merely employ each reception beam pattern once, with the nulling test operation ensuring that whilst each reception beam pattern is employed, each of the wireless terminals will communicate with the base station, and accordingly link quality metrics can be established for each of the wireless terminals when using each of the plurality of reception beam patterns. This may for example be a suitable approach when the nulling test operation is performing during a dedicated test process, where for example each of the wireless terminals can be forced to communicate with the base station at predetermined times, and for example with predetermined test signals.

However, in an alternative embodiment it may not be possible to guarantee that each wireless terminal will communicate with the base station during a set time period whilst a particular reception beam pattern is being used. In such instances, in one embodiment, the reception beam pattern controller may be arranged to perform one or more pattern sweeps, during each pattern sweep one or more of the plurality of reception beam patterns being employed for a predetermined time period. Following the end of a current pattern sweep, a subsequent pattern sweep is performed if communication has not yet been observed from at least one wireless terminal for at least one reception beam pattern. Hence, by such an approach, further pattern sweeps can be performed if necessary, until a point is reached where a desired amount of communication has been observed from each wireless terminal at each reception beam pattern.

In one embodiment, each pattern sweep could repeat all of the plurality of reception beam patterns. However, in an alternative embodiment, each subsequent pattern sweep may operate using a smaller set of the reception beam patterns, in particular concentrating on those reception beam patterns for which sufficient data has not yet been obtained, for example due to at least one wireless terminal not having yet established communication with the base station when the base station is using such a reception beam pattern.

In one embodiment, when performance of multiple pattern sweeps causes communication between a wireless terminal and the base station to be observed by the base station multiple times whilst the antenna assembly is employing a particular reception beam pattern, the quality metric determination circuitry is configured to maintain information to enable an average link quality metric to be determined for that wireless terminal at that particular reception beam pattern. In one embodiment, this could be achieved by aggregating multiple quality metric values whilst also keeping track of the number of measurements observed, which would then later allow an average link quality metric to be determined for a particular wireless terminal whilst a particular reception beam pattern was being used by the base station. If desired, alternative statistical measures could be taken to determine a link quality metric to use, given multiple quality metric values.

Indeed, whilst in one embodiment it may be sufficient to observe just a single communication from a wireless terminal for each reception beam pattern, in alternative embodiments it may be desired to observe multiple measurements from each wireless terminal at each reception beam pattern, and accordingly multiple pattern sweeps may be used for that process.

In one embodiment, to avoid the nulling test operation continuing for a prolonged period, it is possible to make continuance of the nulling test operation dependent on a timeout condition not having been detected. In particular, the reception beam pattern controller may be arranged to terminate the nulling test operation on detection of such a timeout condition. In that event, the quality metric determination circuitry may be arranged, for each reception beam pattern, to allocate a default link quality metric value for any wireless terminal from which communication has not yet been observed for that reception beam pattern by a time the nulling test operation is terminated. The default link quality metric value may take a variety of forms, but in one embodiment could be effectively a zero value to capture that fact that a link has not been established.

As mentioned earlier, the nulling test operation could be performed during a dedicated test process. However, in an alternative embodiment the nulling test operation is performed whilst the base station and the plurality of wireless terminals are operating to communicate normal data traffic. In such embodiments, it may be desirable to use the earlier described approach of allowing multiple pattern sweeps to be performed during the nulling test operation, since it will not typically be able to be guaranteed that all of the wireless terminals will communicate with the base station during a single period of time allocated for a particular reception beam pattern during a single pattern sweep.

In one such embodiment where the nulling test operation is performed during normal data traffic communication, the reception beam pattern controller may be arranged, during the nulling test operation, to cause the antenna assembly to employ a reference reception beam pattern for a period of time between each of said plurality of reception beam patterns being employed. The reference beam pattern can take a variety of forms, and indeed may be altered over time, but in one embodiment the reference reception beam pattern is the reception beam pattern employed for communication with the plurality of wireless terminals prior to the nulling test operation. Such an approach ensures that, even if a particular reception beam pattern being tested during the nulling test operation provides an insufficient link quality for a particular wireless terminal that needs to communicate with the base station during that time, when that communication is retried by the wireless terminal it will be retried whilst the reference reception beam pattern is being used, and since the reference reception beam pattern was the last reception beam pattern that had been used during normal communication, this should enable active data communication to continue, whilst still allowing each of the available reception beam patterns to be tested during the nulling test operation. Such an approach hence effectively provides a safety net, by ensuring that there are predetermined periods of time between testing each reception beam pattern, where a known reception beam pattern is used, which assists in preventing data communication failures occurring whilst the nulling test operation is being performed.

The antenna assembly can take a variety of forms. In one embodiment, in addition to being able to employ a plurality of different reception beam patterns, for example under electronic control, the antenna assembly is also rotatable mechanically, and in particular a rotation controller is provided to rotate the rotatable antenna assembly in order to alter an azimuth direction of the rotatable antenna assembly. Whilst in one embodiment, the rotatable antenna assembly may not be rotated during the nulling test operation, in an alternative embodiment, the nulling test operation can effectively be expanded so as to take into account different potential azimuth directions of the rotatable antenna assembly. In particular, in one embodiment the rotation controller may be configured, during the nulling test operation, to perform a rotation sweep operation in order to rotate the rotatable antenna assembly to each of multiple selected azimuth directions, the reception beam pattern controller being arranged to cause each of the plurality of reception beam patterns to be employed at least once at each selected azimuth direction. The quality metric determination circuitry is then configured to determine the link quality metric for each wireless terminal, for each reception beam pattern at each selected azimuth direction, and the reception beam determination circuitry is arranged to determine both the reception beam pattern to be used for the subsequent communication and an azimuth direction at which the antenna assembly is to be positioned for that subsequent communication.

Accordingly, when adopting such an approach, a separate quality metric/test pattern spectrum is effectively determined for each tested azimuth direction, and then the computation performed by the reception beam determination circuitry utilises that additional information in order to determine both an azimuth direction and an associated reception beam pattern that is considered to achieve the best compromise between seeking to nullify interference sources, whilst seeking to still provide good quality communication with each of the wireless terminals.

The link quality metric determined can take a variety of forms, but in one embodiment relates to an uplink communication from the associated wireless terminal to the base station.

The wireless network can take a variety of forms, but in one embodiment is a wireless backhaul network for coupling a core network to a wireless access network, and the base station is a feeder base station for connection to the core network. In one such embodiment, at least one of the wireless terminals is a feeder terminal for connection to an access point of the wireless access network. Whilst in one embodiment each of the wireless terminals may be such a feeder terminal, in other embodiments some of the wireless terminals may be provided for other functions. For example, some of the wireless terminals may be relay terminals used to relay signals from the base station to further wireless terminals.

There are a number of ways in which such a wireless backhaul network can be deployed. In one embodiment, such a wireless backhaul network is deployed in a license-exempt frequency band. Due to its free availability, the lack of official regulation in such an unlicensed band means that the wireless backhaul network is likely to be subjected to a number of interference sources, and hence the above described mechanisms are particularly beneficial within such an embodiment.

In a second example embodiment, there is provided a method of performing spatial nulling in an antenna apparatus to operate as a base station in a wireless network, the antenna apparatus having an antenna assembly to employ a reception beam pattern selected from a plurality of reception beam patterns, the method comprising: controlling the antenna assembly, during performance of a nulling test operation, to employ each of said plurality of reception beam patterns; determining, for each reception beam pattern employed during said nulling test operation, a link quality metric for each of a plurality of wireless terminals based on communication between the plurality of wireless terminals and the base station whilst the antenna assembly is employing that reception beam pattern; and determining, from the link quality metrics determined for the plurality of wireless terminals for each of the plurality of reception beam patterns, a reception beam pattern from said plurality of reception beam patterns to be used for a subsequent communication with the plurality of wireless terminals.

In a third example embodiment, there is provided an antenna apparatus for operating as a base station in a wireless network, comprising: antenna means for employing a reception beam pattern selected from a plurality of reception beam patterns; reception beam pattern control means for controlling the antenna means to employ each of said plurality of reception beam patterns during a nulling test operation; quality metric determination means for determining, for each reception beam pattern employed during said nulling test operation, a link quality metric for each of a plurality of wireless terminal means based on communication between the plurality of wireless terminal means and the base station whilst the antenna means is employing that reception beam pattern; and reception beam determination means for determining, from the link quality metrics determined for the plurality of wireless terminal means for each of the plurality of reception beam patterns, a reception beam pattern from said plurality of reception beam patterns to be used for a subsequent communication with the plurality of wireless terminal means.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
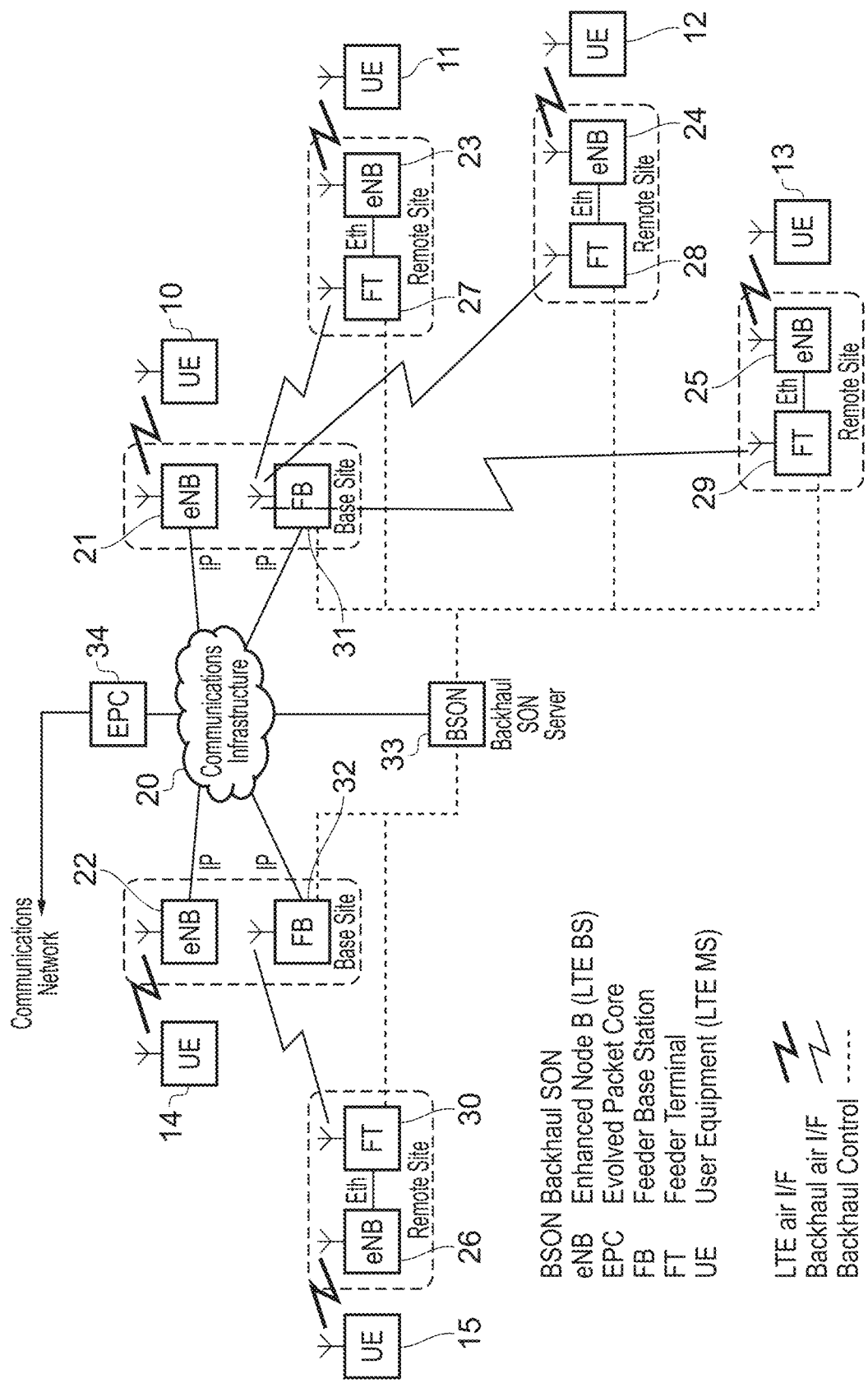
FIG. 1 schematically illustrates a communications network providing connectivity for end user equipment which employs a wireless backhaul network in which antenna apparatuses of some embodiments may be deployed to provide backhaul nodes.

A wireless network may be provided to serve a range of different functions, but one use of a wireless network is to perform backhaul in a communications network where user equipment devices (e.g. mobile telephones) communicate with nodes of the wireless network and the wireless network then enables these nodes to communicate with other nodes of the wireless network, which then connect (typically in a wired manner) to a physical communications infrastructure and then on to a wired communications network such as the internet. There are a number of different use cases and different types of backhaul technologies available to mobile network operators, but in this context there are a number of reasons why it would be desirable to provide nodes of a wireless backhaul network which only communicate with user equipment within a relatively small cell. Small cell deployment can be useful to provide the enhanced quality of service demanded by the ever increasing number of mobile data consumers. Small cells have a number of advantages such as: they allow capacity hot-spots to be targeted to ease congestion, they are appropriate for deploying in a dense outdoor urban environment, for example on street furniture, they can be deployed in specific known "not-spots" where macrocell coverage is poor or within indoor not-spots which experience steady daily traffic with occasional significant peaks, such as dense urban indoor environments like stadiums, shopping malls, and so on. Further, small cells may also be appropriate for mobile deployment, such as in trains, or other moving transport.

In the wireless backhaul use case discussed above, a feeder terminal (FT), i.e. the backhaul node nearest to an access point (AP), which may for example be an eNodeB (eNB) in the context of LTE, may typically be mounted on street furniture or a building facade perhaps 3-6 meters above street level. Conversely, a feeder base (FB), i.e. the backhaul node nearest to the core network, may utilise the same infrastructure as the access macro network.

In view of the above usage context, it is possible that some degree of outage will occur when the backhaul connectivity is unavailable. Outage may for example occur when there is equipment failure, or a persistent or temporary physical obstruction such as heavy rain or vehicles in the line of sight of the backhaul link. Although the use of small cells may enable the target availability of the connectivity to be relaxed, it would advantageous if the nodes of the wireless network were able to reconfigure themselves to provide different communications paths when such outage does occur. Moreover, given the greater number of FTs which need to be deployed when smaller cells are used, in order to facilitate fast, large scale deployment with little engineering required at a new installation site, the ability for the nodes (both FTs and FBs) to self-organise and self-configure is desirable.

In the context of wireless networks, a further consideration which may need to be allowed for is the carrier frequency in which the wireless network operates, both in terms of the corresponding propagation which the carrier frequency allows, but also in terms of the regulatory licencing regimes which apply to a given carrier frequency. Whilst it would be advantageous to provide a wireless network which operates in a licence-exempt frequency band, due to its free availability, the lack of official regulation in such an unlicensed band means that the wireless network must be able to cope with co-channel and adjacent channel interference from unsolicited and uncoordinated wireless sources and furthermore despite any initial well planned deployment, if the wireless network is to be durable (in time) it must be able to adapt rapidly to static or dynamic, fixed or mobile radio traffic from other sources.

Some particular embodiments are now described with reference to the figures. FIG. 1 schematically illustrates a multi-component network which provides connectivity for user equipment (UE) to a communications network such as the internet. The items of user equipment 10-15 of this example communicate wirelessly with LTE base stations—enhanced node Bs (eNBs). These eNBs then either have a direct wired connection (via IP protocol) with the communications infrastructure 20 in the case of 21 and 22, or are connected to an associated feeder terminal (FT) in the case of eNBs 23-26. Each FT is in wireless communication with a feeder base (FB), shown as 31 and 32 in the figure. These FBs are then provided with a wired connection (via IP protocol) to the communications infrastructure 20. Also shown is a backhaul self-organising network (SON) server (controller) 33 which is also shown to be in communication via the dashed line labelled "backhaul control" with the FTs and FBs of the wireless backhaul network, but it should be appreciated that this connection shown is logical and in fact will typically be provided via the wired connection to the communications infrastructure and the wired and/or wireless connection discussed above leading to these FBs and FTs. The communications infrastructure 20 is connected to a communications network (e.g. the internet) via the evolved packet core (EPC) 34. In the particular example of the wireless backhaul network shown in FIG. 1, the nodes (FBs and FTs) are intended to support the provision of relatively small cells, to be easily and rapidly deployable, and to operate well in an unlicensed region frequency band, such that they must be able to cope with co-channel and adjacent channel interference from unsolicited and uncoordinated wireless sources and furthermore be adaptable when the conditions in which they are operating change.

Figure 2:
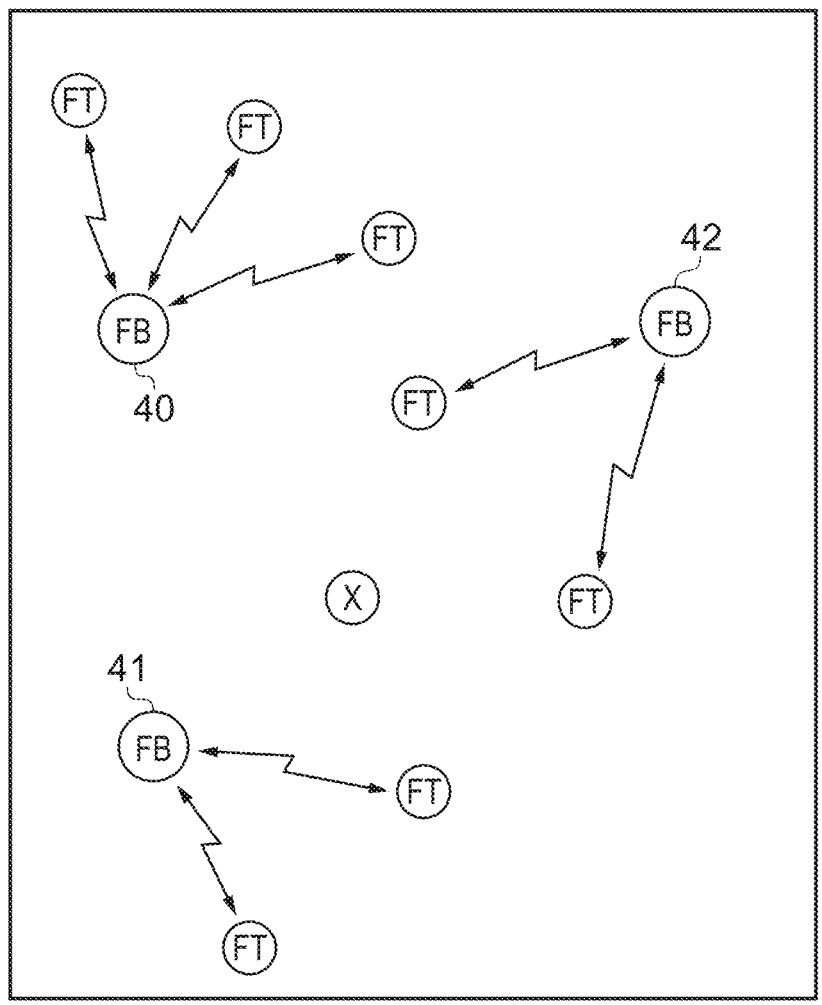
FIG. 2 schematically illustrates a number of feeder bases and feeder terminals in a wireless backhaul network and a source of external interference.

In FIG. 2, seven FTs are shown and three FBs as well as a source of external interference "X". Accordingly, in order to provide good throughput in this wireless backhaul network, this is improved if each node (FT and FB) of the wireless backhaul network are configurable in order to provide a high spectral efficiency. The wireless communication paths shown in FIG. 2 correspond generally to the line of sight (LOS) path between a FB and a FT, and therefore it is advantageous if the antenna provided in association with each FT and FB can be orientated to provide a strong beam in the direction of its communication partner and to suppress interference from other sources. For example, taking FB 40 as an example, it can be seen that if the directionality of its antenna is approximately aligned with the middle FT with which it communicates, but has a sufficiently broad beam width, then good communication throughput with its associated FTs can be achieved without significant interference from the other items in the figure arising. Similarly, the FB 41 can achieve the same by being orientated in a direction lying approximately between the two FTs with which it communicates, and having a beam width with sufficient width to accommodate both the line of sight directions to each of its communication partners. However, in both examples (FB 40 and FB 41), this may further depend of the strength of the external source "X", and if this is sufficiently strong in their direction, the directional orientation of FB 40 and the FB 41 may be better turned slightly away from the source "X", to reduce the interference which it generates. This is potentially a more significant problem for the FB 42, since the external interference source lies between the line of sight directions to its two communications partners. Accordingly, FB 42 may need to be generally orientated in the direction of the external interference source "X" but a beam pattern may be best selected which has a strong null in its central direction, but with reasonably strong lobes in the direction of its communication partner FTs in order to maximise the signal to noise ratio which it can achieve.

Figure 3:
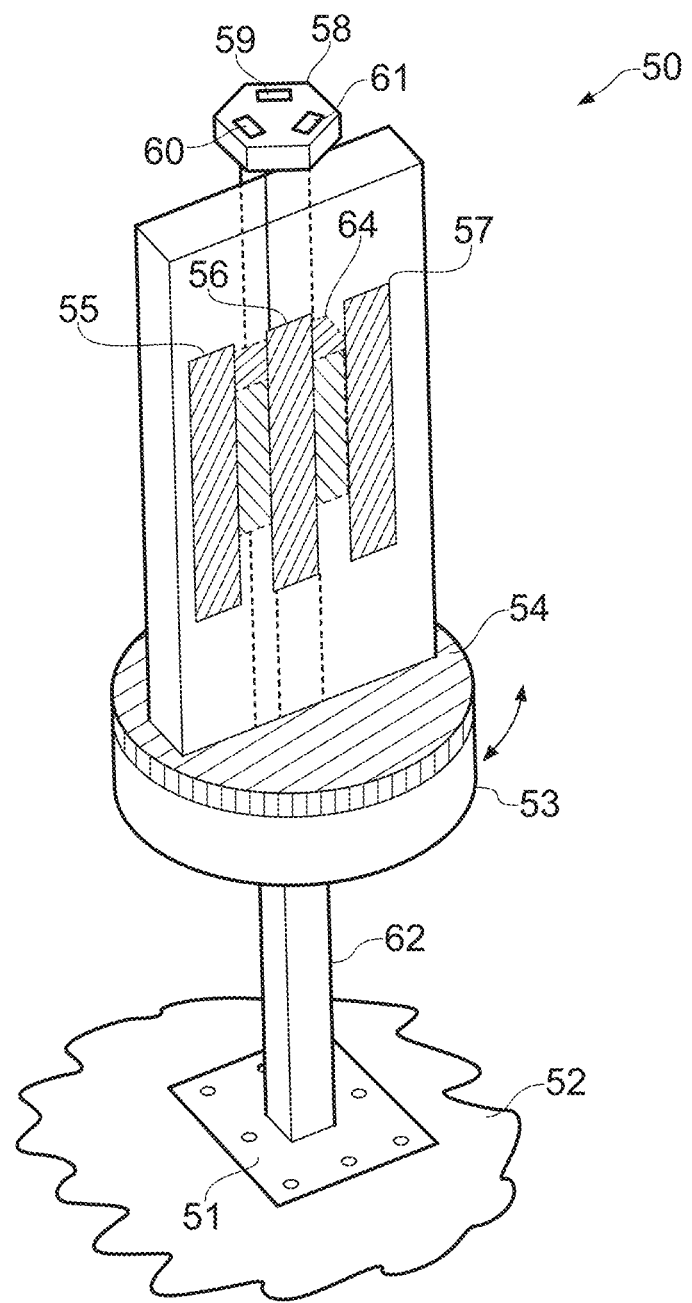
FIG. 3 schematically illustrates an antenna apparatus in one embodiment.

FIG. 3 schematically illustrates the general configuration of an antenna apparatus according to the present techniques, in one embodiment. The antenna 50 has a base plate 51 which enables the antenna to be fixably mounted to its physical location 52. The base plate 51 and the physical location 52 shown is just one example, where in FIG. 3 the physical location 52 is essentially a flat surface, but it should be appreciated that the fixing of the antenna can be provided in a variety of ways, in dependence of the style of configuration which is desired and the type of physical location to which the antenna should be attached. For example, where the antenna should typically be connected to a vertical component such as to the side of a building, street furniture, and so on, a simple mounting bracket directly provided on the side of the base portion 53 may be more appropriate. The base portion 53 remains fixed whilst the rotating portion 54 is able to rotate through at least 360°, by means of a motor within the base portion 53 (not visible in this figure) which causes the rotating portion 54 to be rotated and held at a particular position with respect to the base portion 53. The example antenna 50 has a directional antenna formed of 3 antenna array components 55, 56 and 57, which can be seen in FIG. 3 to be elongate columns. Also visible in FIG. 3 is a circular antenna array 58 formed of 3 antenna components 59, 60 and 61. This is mounted atop the vertical column 62 which runs from the base plate 51 through the antenna apparatus 50, such that the circular antenna is fixed with respect to the physical location 52 of the antenna apparatus, but this need not be the case and other embodiments are conceivable in which the circular antenna is mounted on top of the directional array, so that it rotates therewith. Partially shown in FIG. 3 are the RF electronics 64 which are situated behind the directional array, and couple the antenna array components 55-57 to a transceiver (also not shown). This arrangement wherein the RF chains are physically closely located to the antenna array components means that, despite the rotational capability of the antenna apparatus, good signal fidelity is nevertheless maintained. Only a limited number of signals need be transferred from the rotating RF chain electronics 64 across the rotating interface to the fixed portion 53. It should be appreciated that the antenna apparatus 50 will typically also be provided with a radome cover to protect its components, but this has been removed in the illustration of FIG. 3 for clarity of illustration purposes only.

Figure 4:
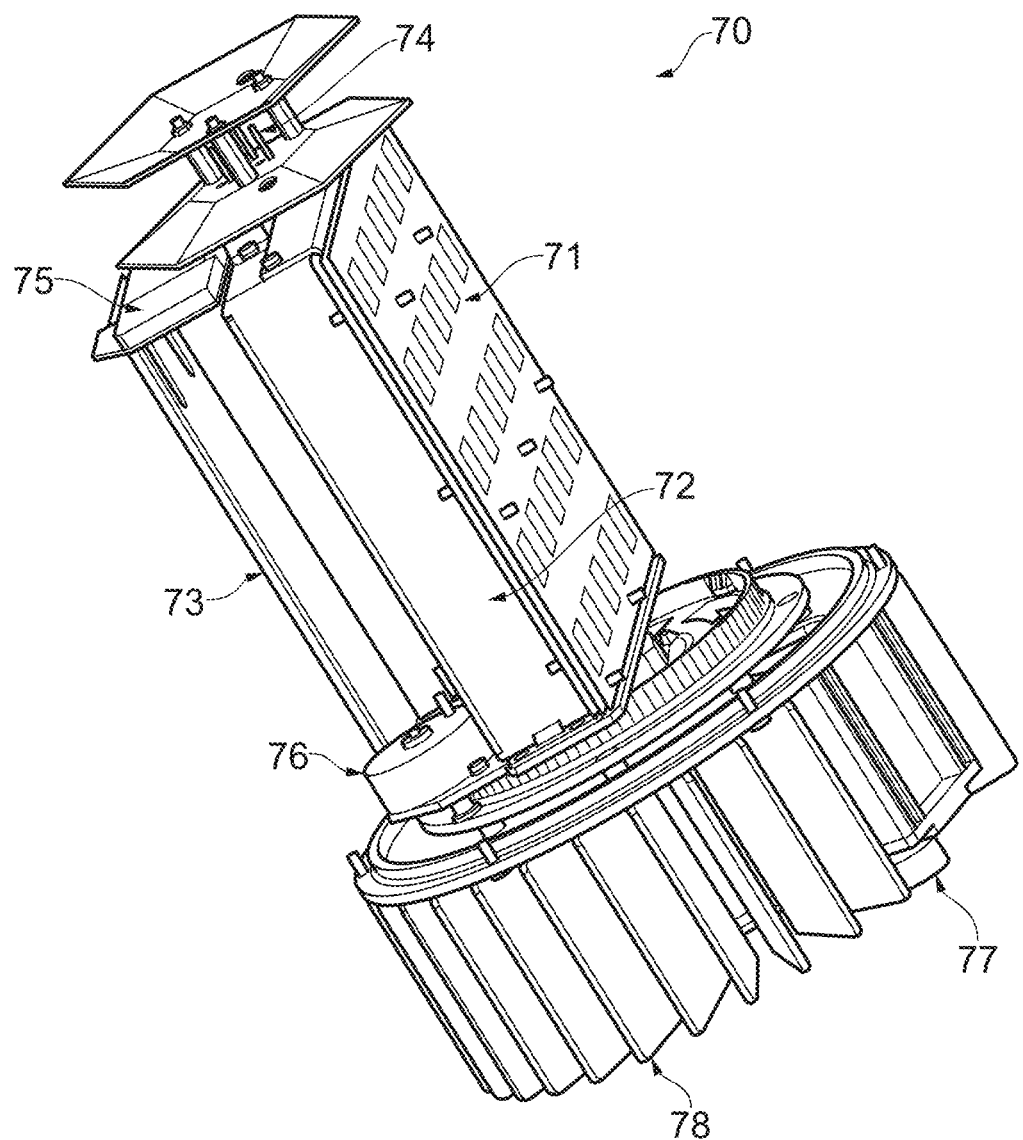
FIG. 4 schematically illustrates an antenna apparatus in one embodiment.

FIG. 4 schematically illustrates in more detail the components of an antenna apparatus 70 in one embodiment. In this embodiment, the directional antenna 71 can be seen to comprise 25 antenna array components arranged in a 5×5 grid. RF and base band electronics (i.e. essentially the RF chains) 72 are provided behind the main directional antenna assembly. These are not directly visible in the illustration of FIG. 4 due to the casing. The antenna 70 further comprises a rear-firing antenna 73 which is orientated in the opposite direction to the front firing main antenna 71. Although not visible in FIG. 4, the rear firing antenna 73 comprises a single column of antenna array elements forming a single antenna array component, which is physically very similar to a single column within the 5×5 array of antenna array elements of the front antenna 71. A circular antenna 74 is mounted on top of the front-firing main antenna 71 and is configured as a triple-monopole antenna which is used, as described above, for assessing the environment in which the antenna 70 finds itself. A further GPS antenna 75 is also provided in the antenna apparatus 70, which is used for node location, orientation and precise time synchronisation. A motorised steering mechanism 76 enables the antenna apparatus to be orientated in any direction in azimuth, and a gigabit Ethernet network interface 77 is provided to connect the antenna further. The fins 78 are for heat dissipation. Note also that the RF and base band electronics 72 mounted behind the front firing main antenna 71 are also connected to the circular antenna 74 and the rear firing antenna 73 as will be discussed in more detail below.

Figure 5A:
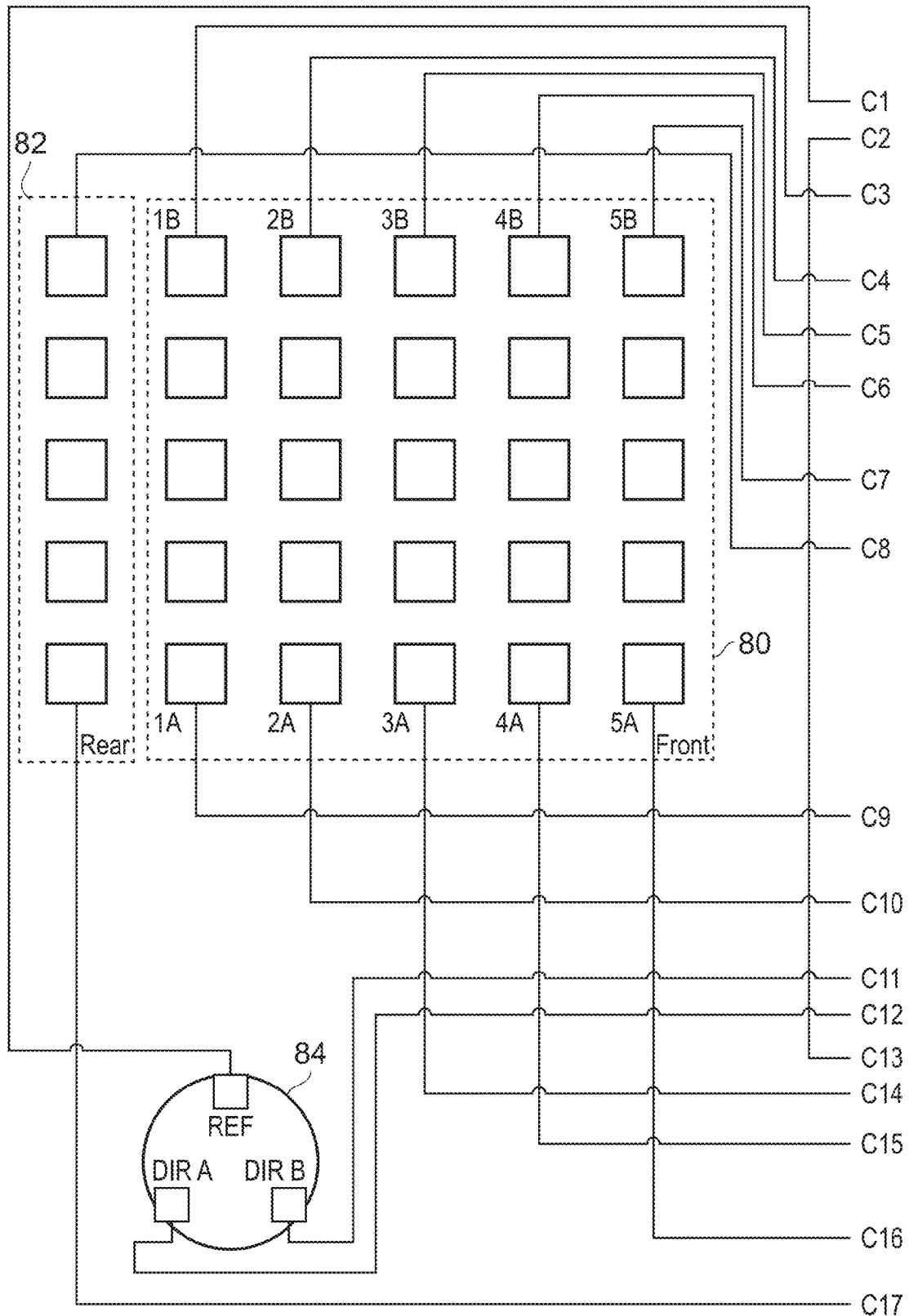
FIGS. 5A, 5B and 5C schematically illustrate RF chains which are at least partially shared between front, back and circular antenna array components in one embodiment.
Figure 5B:
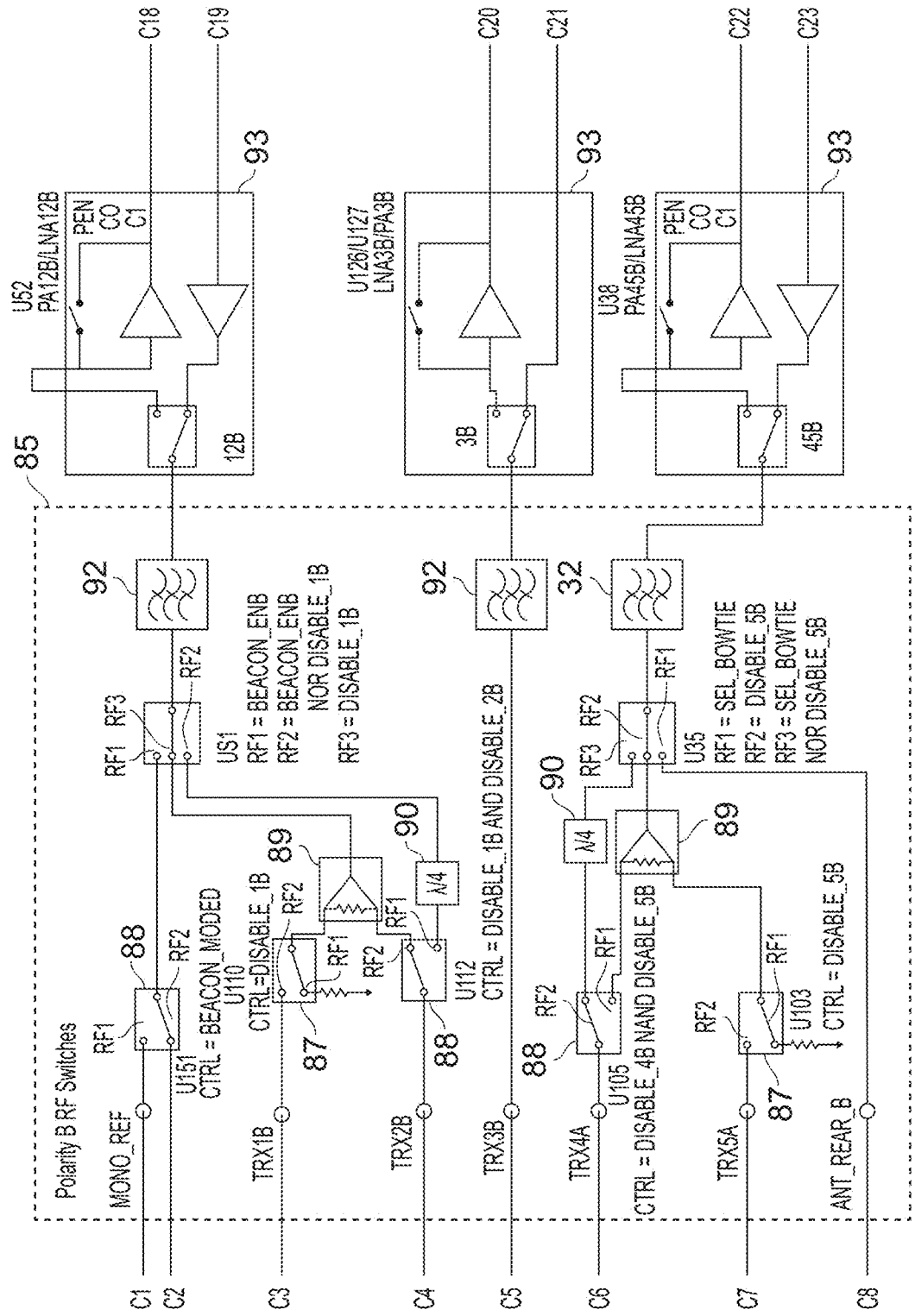
Figure 5B:
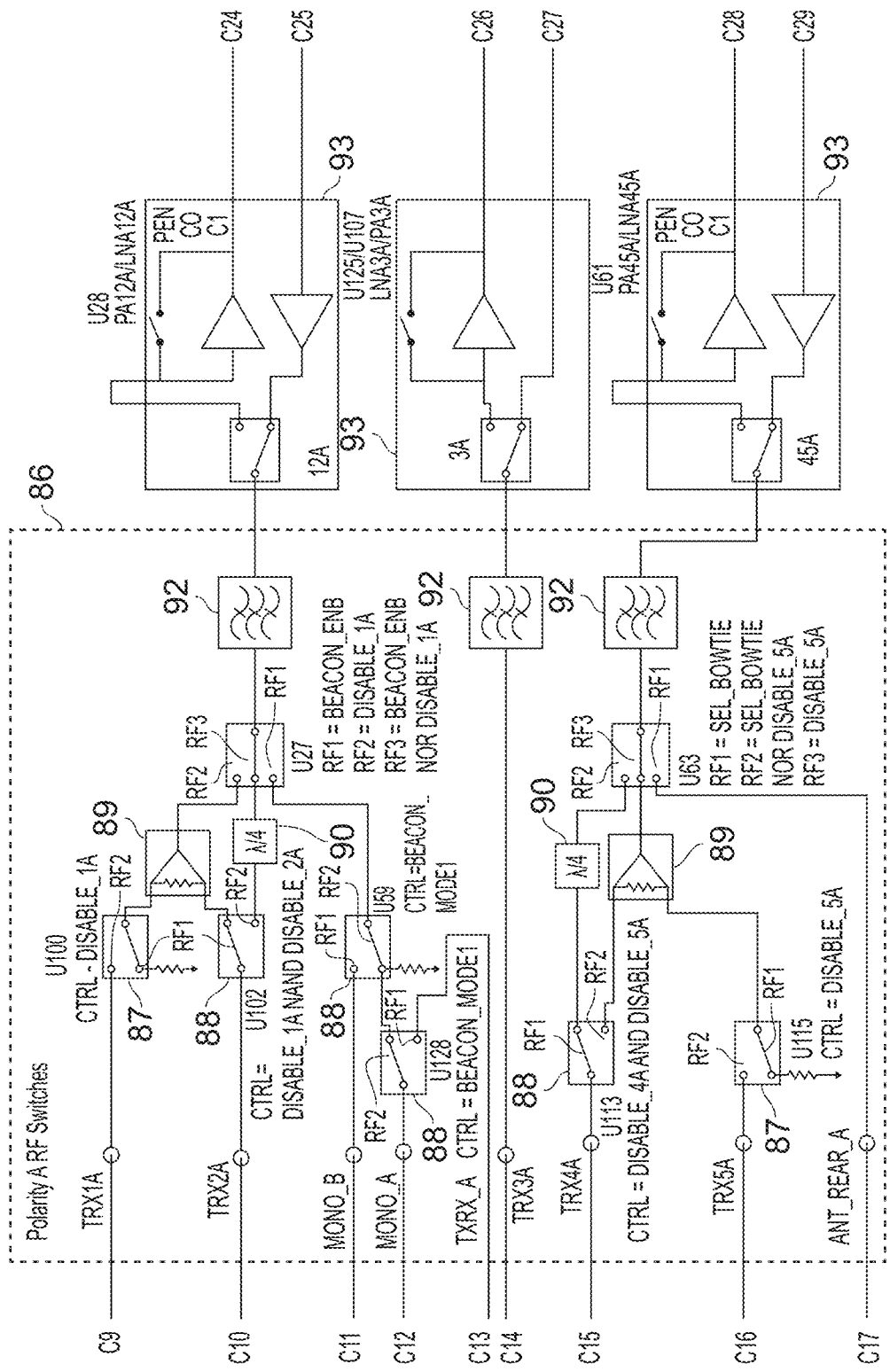
Figure 5C:
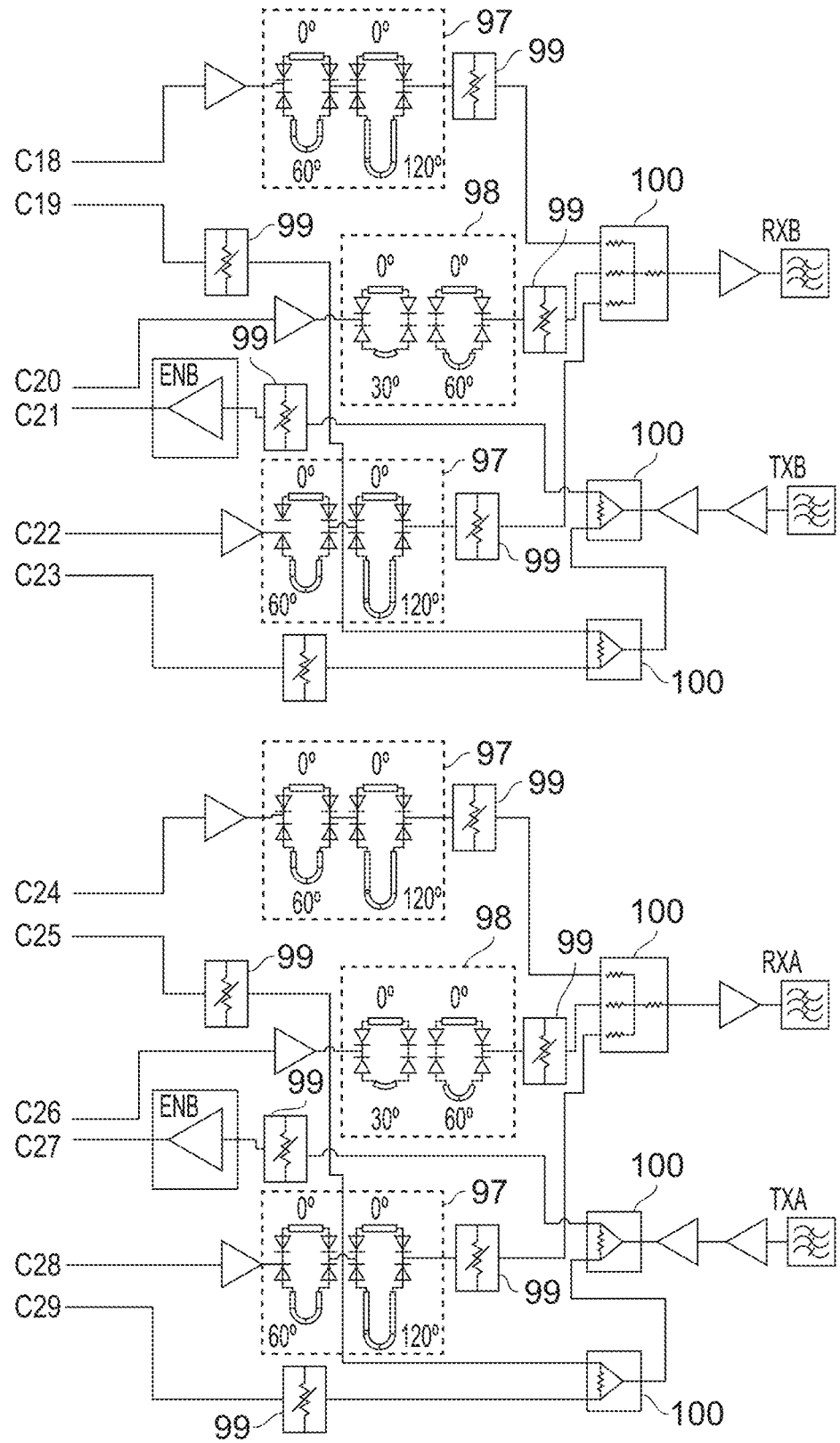

FIGS. 5A-C schematically illustrates the manner in which the RF chains are configured in one embodiment such as that illustrated in FIG. 4. The schematic is split across three sub-figures merely for clarity of illustration. The connections C1-C29 are purely a feature of this manner of illustration, showing how the respective connections continue from one sub-figure to the next. The patch antenna array elements of the front directional antenna are illustrated by the 5×5 set of squares 80 in FIG. 5A. On the left next to these are shown a column of patch elements 82, forming the rear facing antenna. Lower down in FIG. 5A, three antenna array elements 84 are shown, which provide the circular antenna. Turning to FIG. 5B, the nearest components to the array elements are the sets of first and second (A and B) polarity switches 85 and 86. These couple the RF chains to the lower edge (A) of the 5×5 array of patch elements and to its upper edge (B). Two orthogonally polarized signals can thus be applied to all elements of the 5×5 array of patch elements. Note that these sets of polarity switches 85 and 86 also comprise selection switches which either select between the corresponding antenna array component or a terminated input in the case of the selection switches 87, or select between two different possible connection paths for the corresponding array components in the case of selection switches 88. Accordingly, whilst the switching circuitry 88 simply enables certain antenna array components to be enabled or not, the switching circuitry 88 can be seen to provide sharing between the antenna array components for the elements of the RF chain which follow it. Certain pairs of connection paths are paired and feed into the two inputs of summation circuitry 89, which therefore enables both antenna array components to which the summation circuitry 89 may be connected (if both incidences of the switching circuitry 87 and 88 are so set) to be active and summed by the summation circuitry 89. Alternative selectable paths are also provided via the quarter wave-length (λ/4) shifters 90.

Proceeding rightwards in FIG. 5B, the signal 92 thus selected is provided to the set of direction selection circuitry 93 which enables switching between receiver and transmitter modes, only allowing signal transfer in one direction, by virtue of the selection between two directional paths. Thereafter, continuing rightwards to FIG. 5C, each RF chain comprises, for the receiver path, phase shifting circuitry 97 or 98. Each phase shifting circuitry comprises 4 fixed length phase paths which can be selectively engaged to enable phase shifts of 0°, 60°, 120° or 180° in the case of phase shifting circuitry 96, or phase shifts of 0°, 30°, 60°, or 90° in the case of phase shifting circuitry 98. This enables phase ramps of +/−60°, +/−30° and 0° to be applied across the array. FIG. 5C also shows gain circuitry 99, which is provided for each RF chain, both in the transmitter and receiver direction. Variability in the gain applied by these gain stages firstly allows a normalisation in gain variation between the columns (measured and calibrated during manufacture) and secondly, in the case of the central column, the variable gain is advantageous in allowing a fine tuning of main-lobe beam-width and hence adjacent null positions. Finally, each RF chain comprises summation circuitry 100 which enables further sharing of the RF chains.

It will be appreciated from the illustration of FIGS. 5A-C therefore that the sharing of the RF chains enables components of the RF electronics to be shared between the antenna (front, rear and circular) components, enabling a reduced size of RF electronics and cost thereof, in particular due to the shared phase shifting circuitry, such that not only is an antenna apparatus which is cheaper provided, but also one in which the RF electronics can be easily comprised within the portion of the antenna which rotates, and thus in close proximity to the antenna array components. Not only does this improve signal fidelity, it also facilitates the physical rotation of the antennas.

Note also from FIGS. 5A-C that independent RF chains are provided for each polarization allowing the signals transmitted and received by the front and rear antenna to be ±45° polarized, giving two polarizations, where each polarization carries a complex I/Q modulated signal. Note that these orthogonal polarizations are used to carry two streams of MIMO (multiple-in, multiple-out) encoded data, in a manner with which one of ordinary skill in the art will be familiar. It should be noted that the RF feed network could be routed to either edge (top or side) of the array, but merely for physical layout reasons of the particular embodiment shown here, the top/bottom design has been chosen. Various orthogonal polarizations may be employed, just three examples being: +/−45°, vertical/horizontal, and right-hand and left-hand circular polarization. Finally, note that certain combinations of antenna array components cannot be activated simultaneously. This allows further reduction in the number of RF chain components that must be provided by sharing RF chains between these components, yet the present techniques have nevertheless found that a useful range of beam patterns can be provided as will be discussed in some more detail below.

Figure 6:
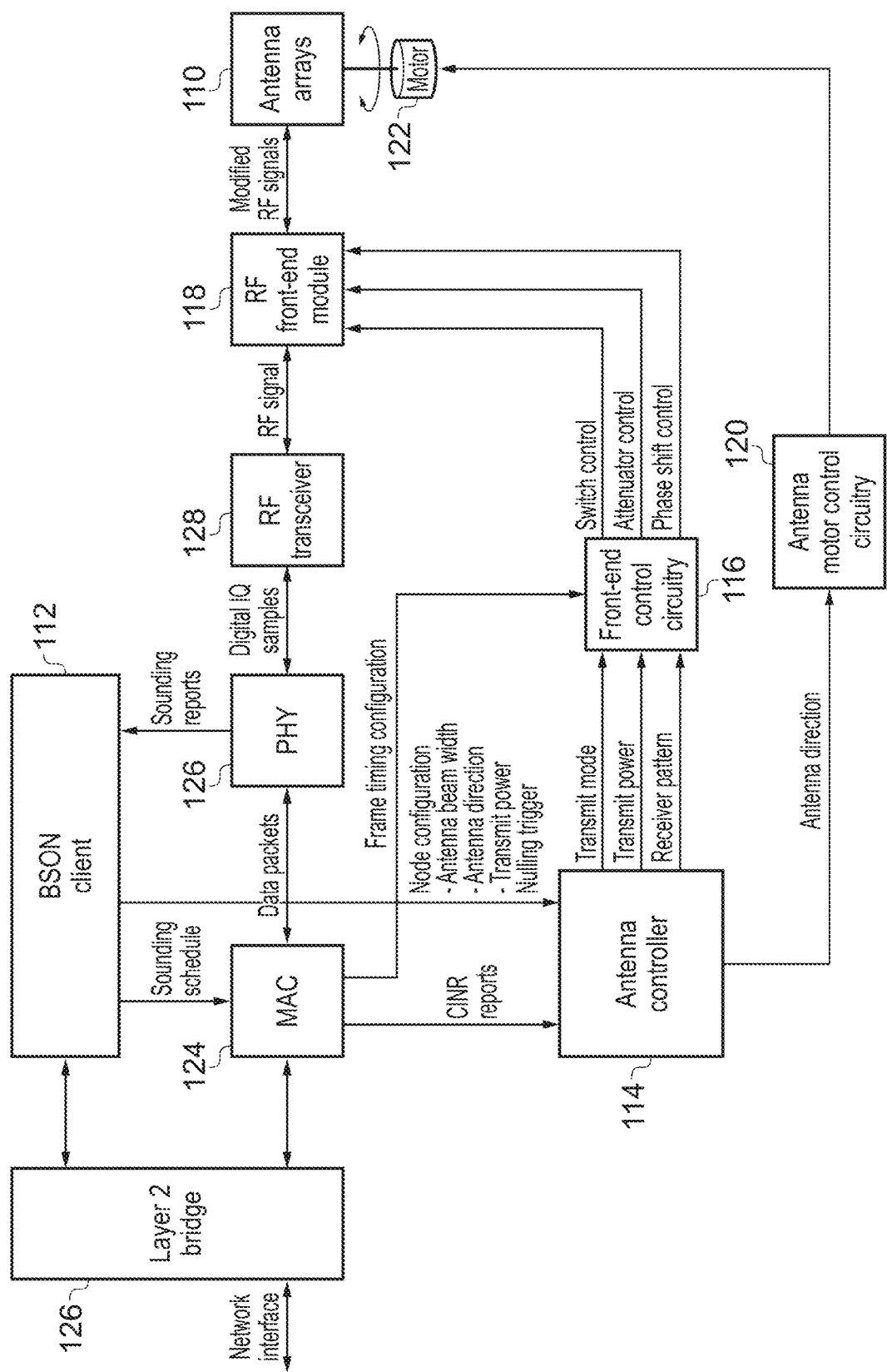
FIG. 6 schematically illustrates control circuitry and signal processing circuitry which are connected to the antenna arrays of one embodiment, both within the antenna apparatus itself and in other network components to which it is connected.

FIG. 6 schematically illustrates the connections of the antenna arrays (front, rear and circular) 110 in one embodiment. The antenna arrays 110 are controlled by some of the other components shown in FIG. 6. A backhaul self-organising network (BSON) client 112 (software running in the same housing as the antenna apparatus) provides node configuration including antenna beam width and direction, and transmit power and a nulling trigger to an antenna controller 114. This BSON client communicates with an external BSON server (not shown in the figure). However, additionally the antenna controller 114 may autonomously select the receiver pattern which maximises throughput based on carrier to interface and noise ratio (CINR) measurements. The antenna controller 114 controls the antenna arrays by passing configuration information for the transmit mode, the transmit power and the receiver pattern to the front end circuitry 116. The front end control circuitry 116 converts these into the required switch control signals, gain control signals and phase shift control signals which are passed to the RF front end module 118. The RF front end module 118 represents the components of FIG. 6 in which the components other than the antenna array components in FIG. 5 are to be found. The antenna controller 114 also indicates an antenna direction to the antenna motor control circuitry 120, which controls the motor 122 in order to orientate the antenna arrays 110 in azimuth. A modem data path is provided comprising the MAC 124, the PHY 126 and the RF transceiver 128, which then couples to the RF front end module 118 in order to provide this with the RF signals which the RF chains modify before passing them to the antenna arrays 110. In other words, data packets are sent between the MAC 124 and the PHY 126, digital IQ samples are passed between the PHY 126 and the RF transceiver 128, and RF signals are exchanged between the RF transceiver 128 and the RF front end module 118. The BSON client 112 (BSON controller) also generates sounding schedules to be implemented by the antenna apparatus which are received by the MAC 124. The MAC 124, like the BSON client 112 communicates with a Layer 2 bridge 126 which is coupled to the network interface.

Figure 7:
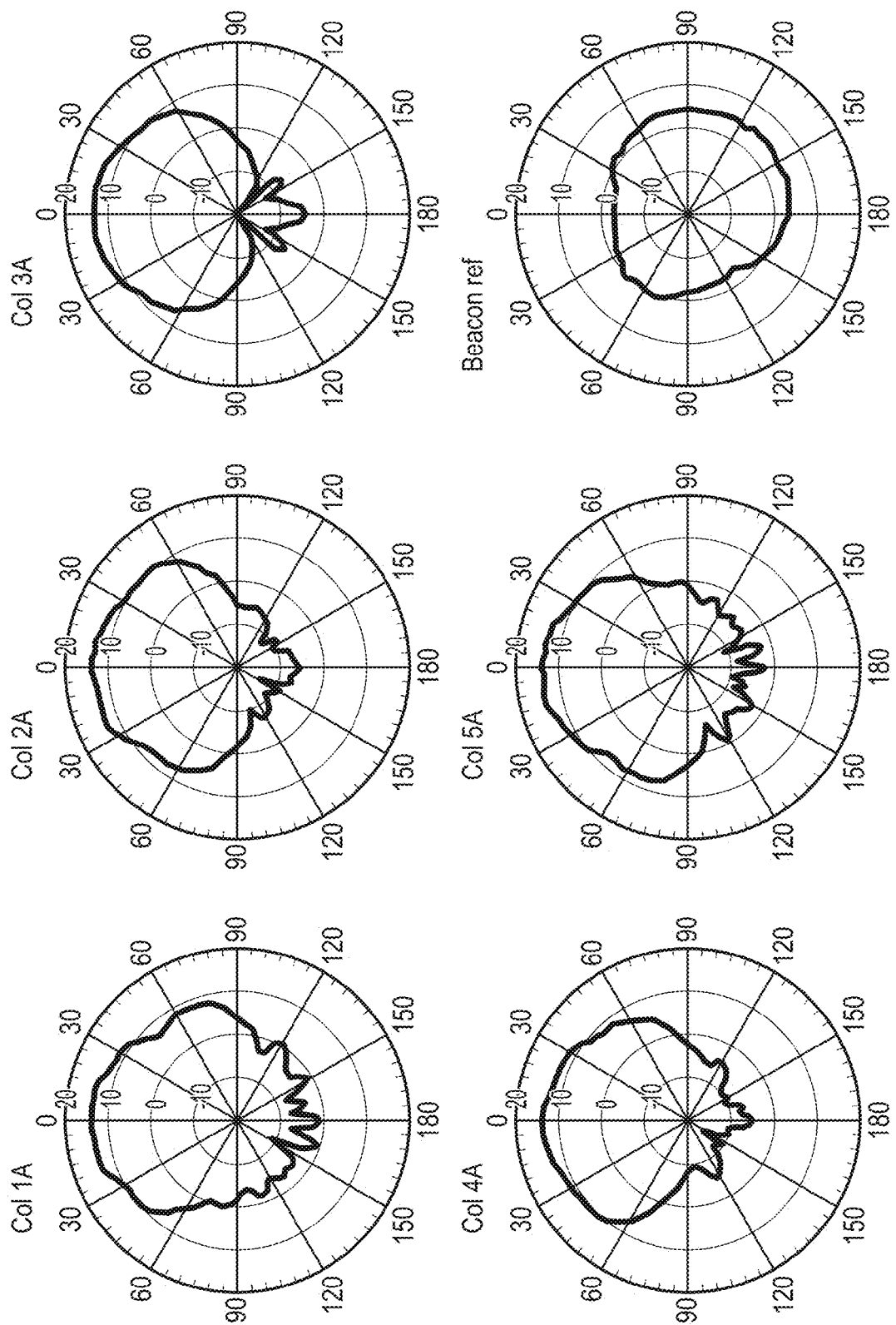
FIG. 7 shows a subset of the beam patterns which are available to an antenna apparatus in one embodiment.
Figure 7:
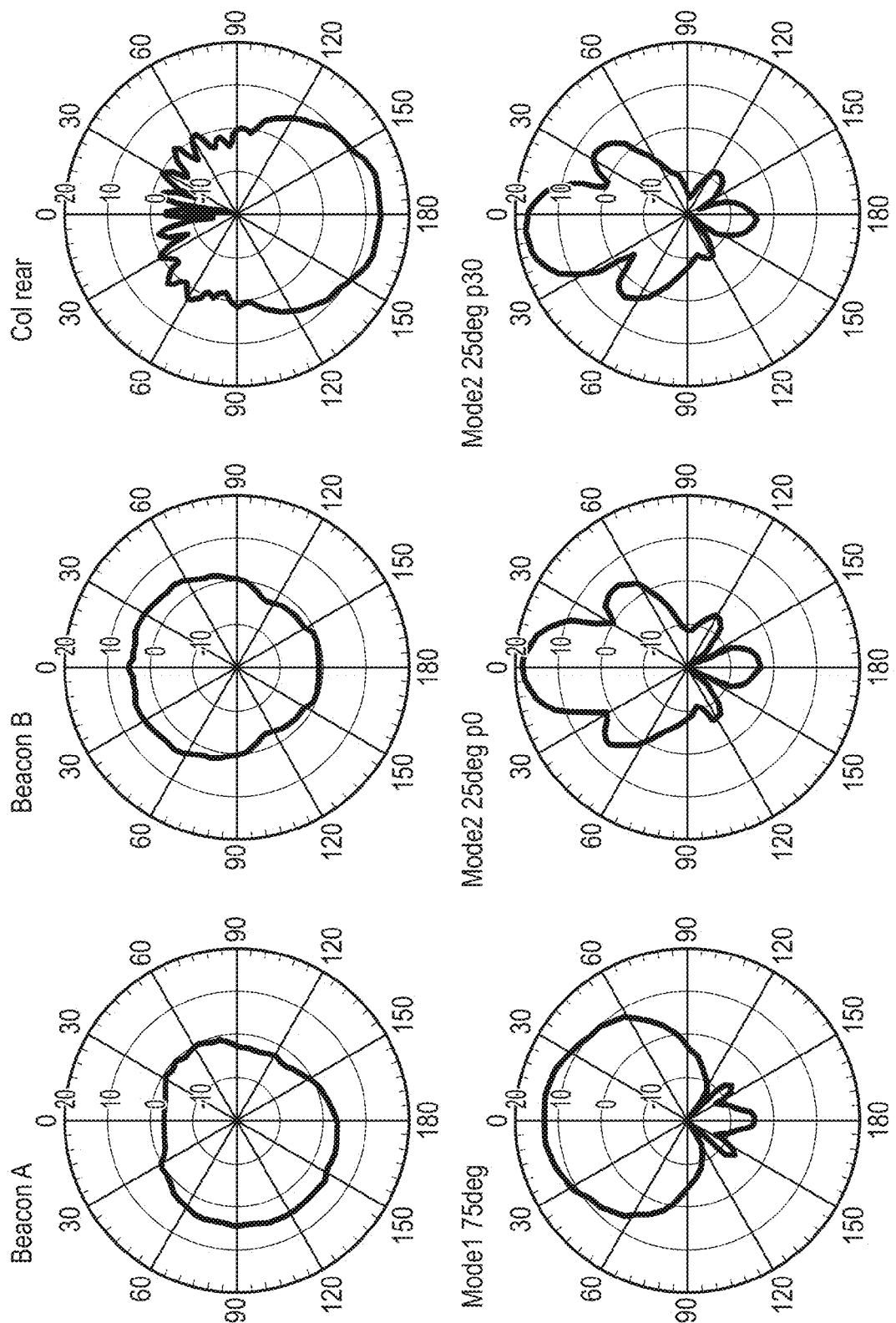
Figure 7:
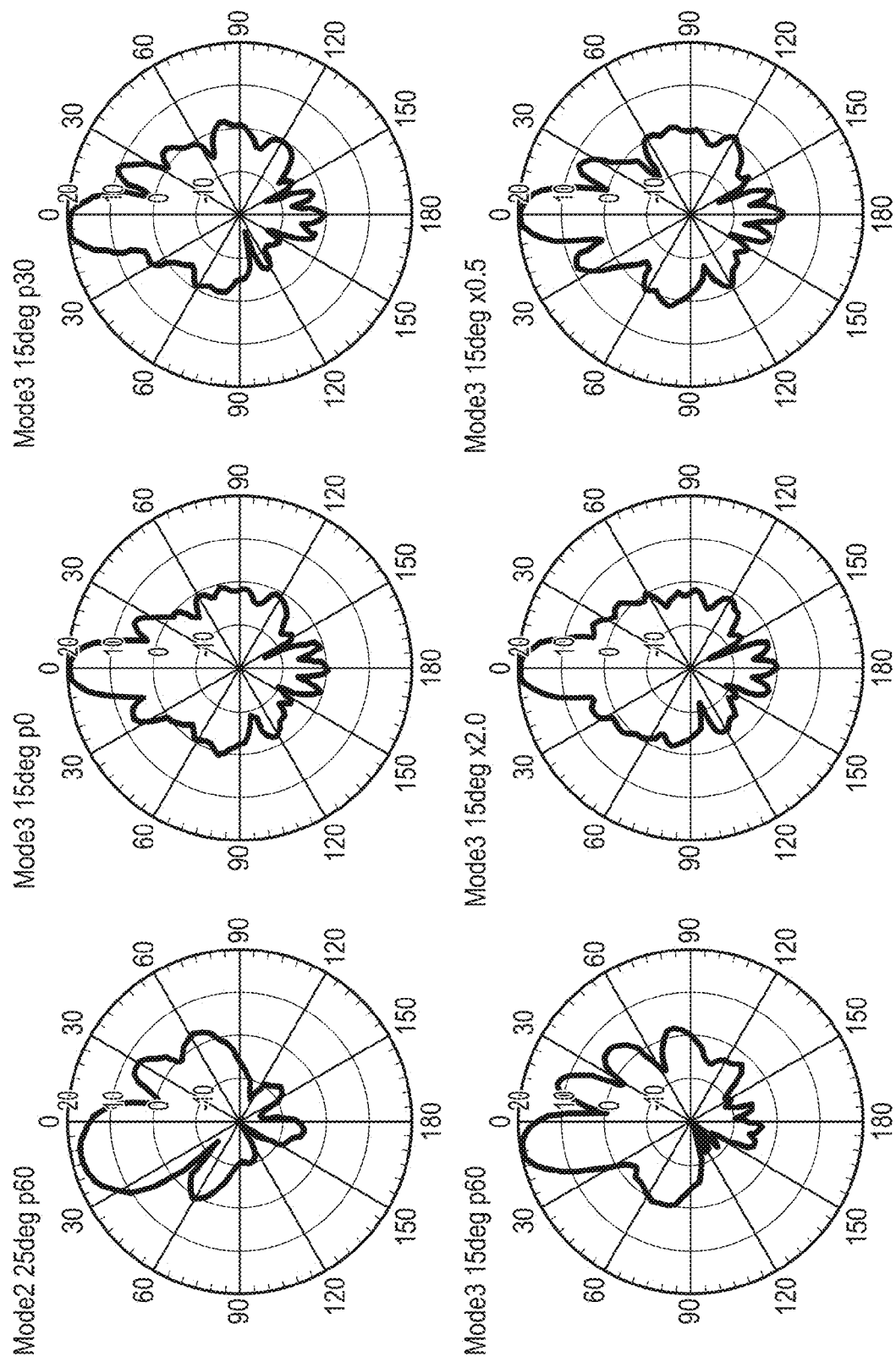
Figure 7:
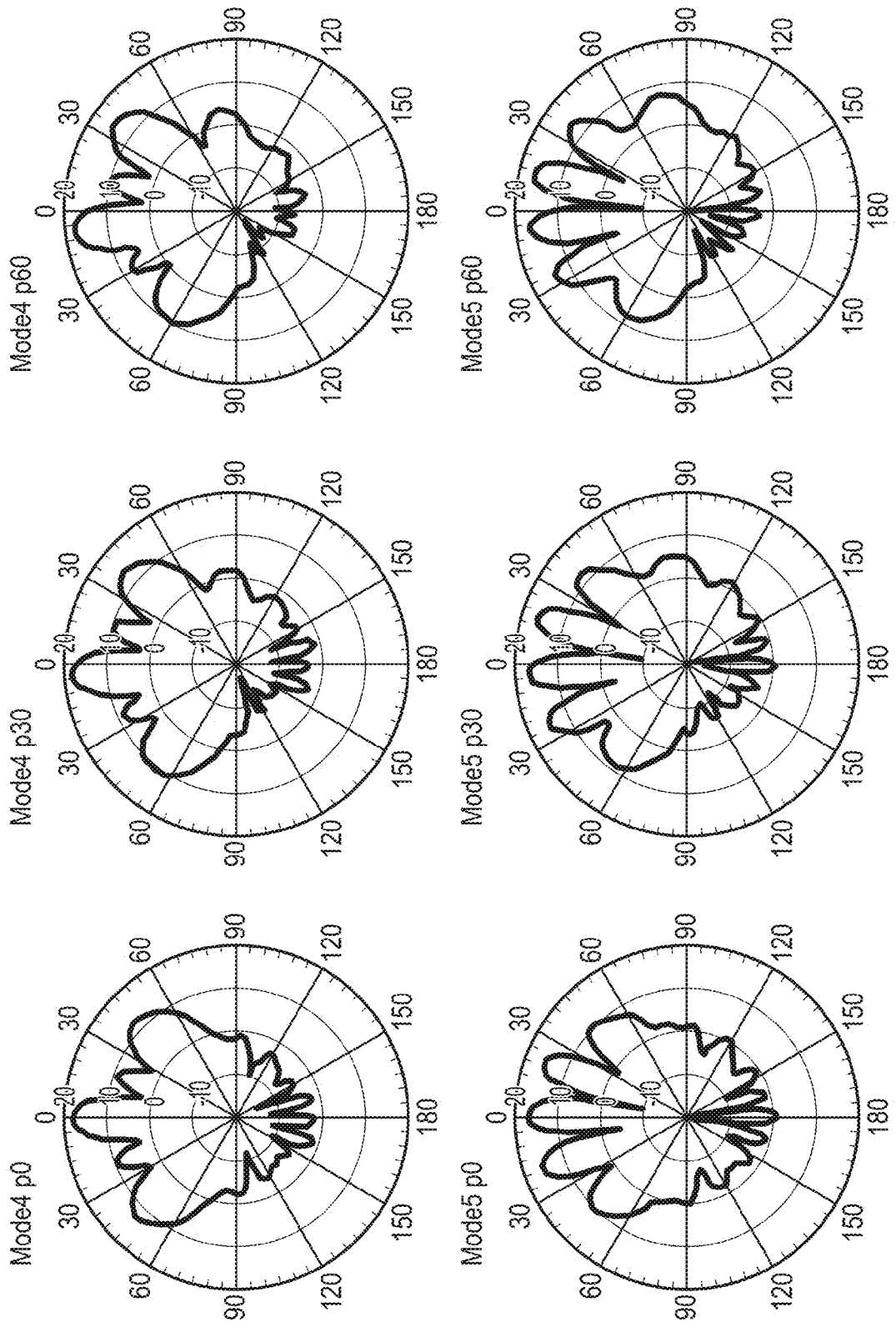
Figure 7:
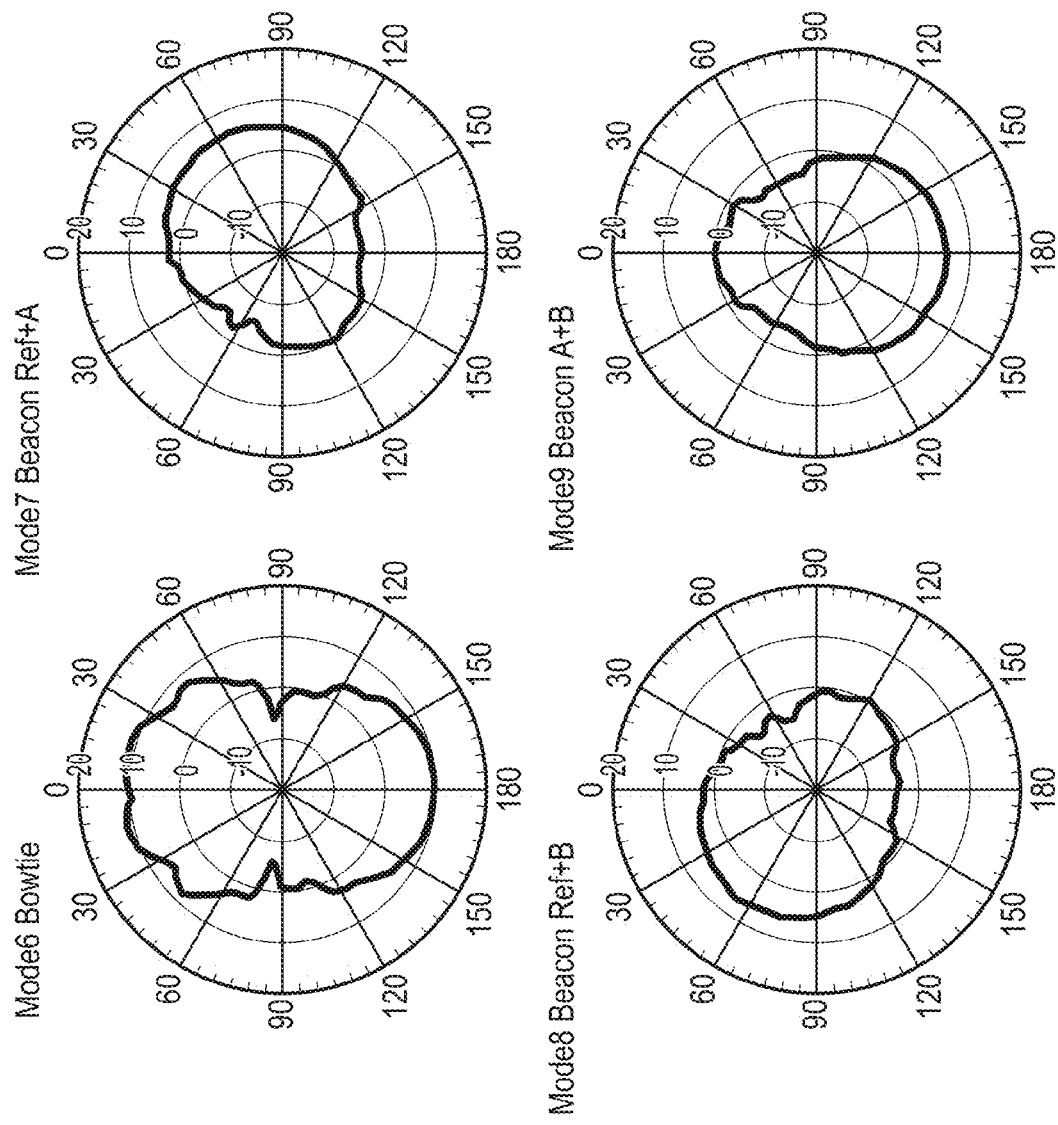

FIG. 7 shows a subset of the beam patterns which can be generated by an antenna array configured such as is illustrated in FIGS. 5 and 6, showing the useful range of beam patterns available. In FIG. 7 the following classes of beam patterns can be identified:

Narrow beams with a single main lobe and of various beam widths, where side lobes are significantly reduced relative to the main lobe;
Electronically steered beams that combine signals at RF, enabling antenna directivity to the left or right of the bore sight of the array;
Beams with grating lobes, where the array pattern has equally strong peaks in multiple directions and deep nulls with significant attenuation (gain <1) in other directions;
A bowtie configuration;
Three 'beacon' omni-directional patterns.

Combined with the above discussed rotating mechanism, the antenna apparatus thus provided, using a fixed set of beam patterns, improves over traditional uniform linear arrays, by being able to maintain a peak gain in any direction. For uniform linear arrays, it is known that the array gain decreases as the angle from the bore sight increases. In addition, the antenna apparatus provided is economically more attractive than more complex circular arrays. For example, ten complete transceiver chains with an aperture of 6.08λ, would generate an antenna pattern with 25° beam width. Embodiments of the antenna apparatus described herein have an aperture which is 4λ and use only two transceiver chains (note that the RF chains shown in FIGS. 5A to 5C reduce down to two connections in the receiver direction and two connections in the transmitter direction) and the narrowest beam that can be generated is 15°. Overall therefore the antenna apparatus provided by the present techniques enables the maximum gain to be orientated in any direction in 360°, whilst improving diversity reception and conversely interference nulling from any direction using a rich set of multiple transmitter and receiver beams.

Figure 8:
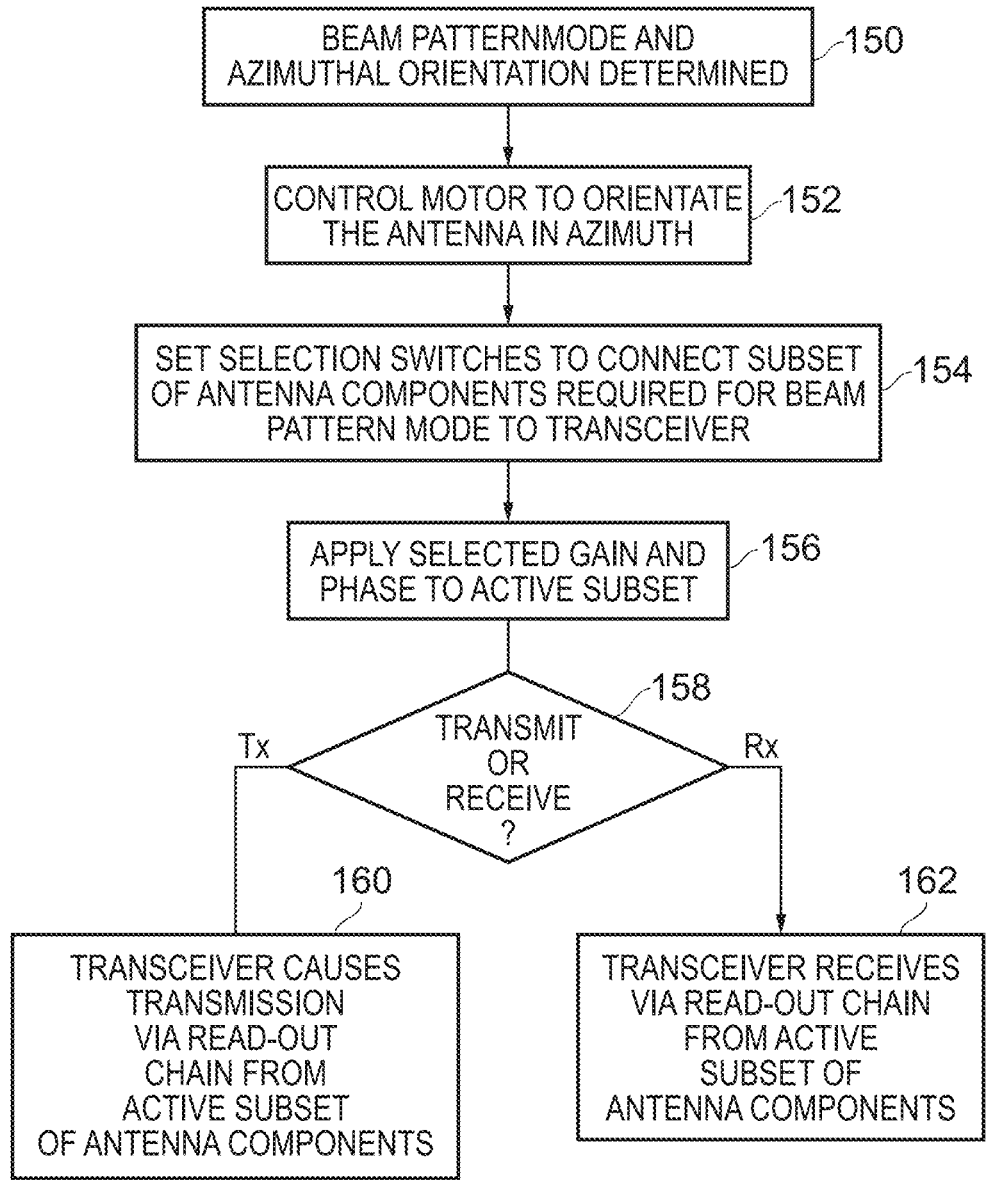
FIG. 8 shows a sequence of steps which are taken when operating an antenna apparatus in one embodiment.

FIG. 8 shows a sequence of steps which are taken in the method of one embodiment. At step 150 a beam pattern mode and azimuthal orientation are determined for the antenna apparatus and at step 152 the motor of the antenna apparatuses control orientates the antenna in azimuth. At step 154 the selection switches of the RF front end module are set to correctly connect a subset of the available antenna components required for the selected beam pattern and mode to the transceiver. Then at step 156 the selected gain and phase are supplied to this active subset by means of switching of the corresponding gain circuitry and phase circuitry in the front end electronics. Then finally, at step 158, if the antenna apparatus is being operated in transmission mode the flow proceeds to step 160 and the transceiver causes transmission via the RF chain from the active subset of antenna components, whereas if the antenna apparatus is being operated as a receiver, then the flow proceeds to step 162 where the transceiver receives via the RF chain from the active subset of antenna components.

A process that may be performed by a feeder base station to seek to reduce its reception beam's sensitivity to interference sources, whilst still seeking to provide a good quality link with the various feeder terminals that communicate with that feeder base station, will now be described with reference to the following figures. Whilst the technique described hereafter can be applied within the feeder base station as described with reference to the earlier figures, these techniques can also be implemented within other forms of feeder base station provided that those feeder base stations support the use of multiple different reception beam patterns. For example, in some embodiments, there is no need for the antenna assembly to be mechanically rotatable in order for the techniques described hereafter to be utilised. Similarly, there is no requirement for the components of the RF electronics to be shared between the antenna components as per the embodiment of FIGS. 5A to 5C.

Figure 9:
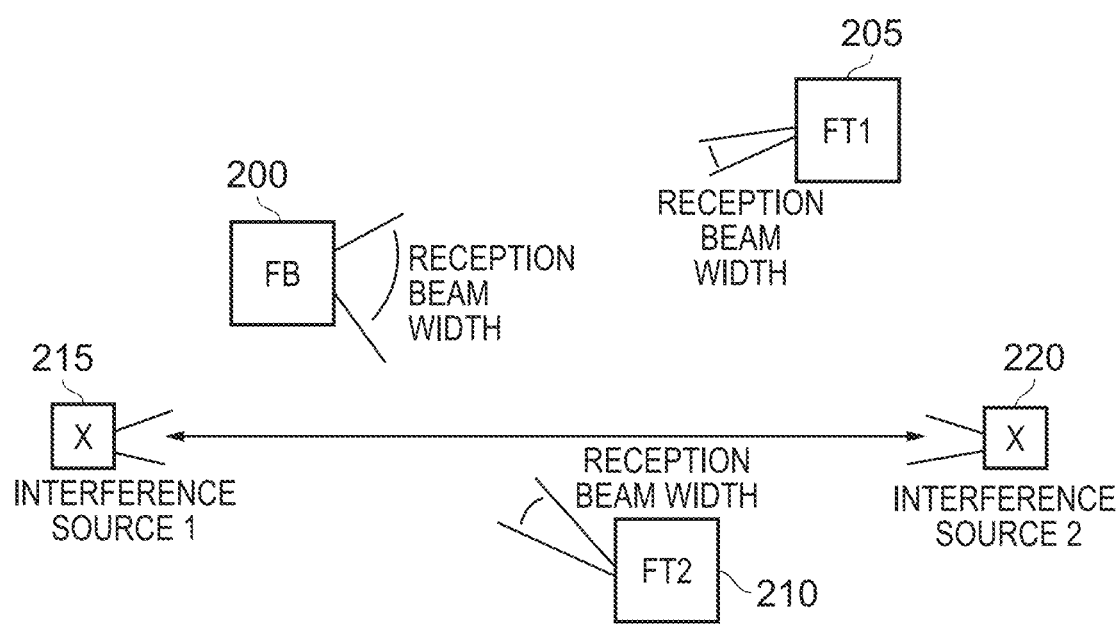
FIG. 9 schematically illustrates how interference sources may affect reception beams within a wireless backhaul network.

FIG. 9 schematically illustrates how an interference source may be observed by the reception beams of various feeder base stations and feeder terminals in accordance with one embodiment. A feeder base station 200 is shown which is in communication with two feeder terminals 205, 210. It will be appreciated that typically an individual feeder base station may be arranged to communicate with more than two feeder terminals, but for ease of illustration only two feeder terminals are considered.

As shown in FIG. 9, it is typically the case that the reception beam widths used by the feeder terminals are relatively narrow, since they are only in point-to-point communication with a single feeder base station, and accordingly it is often the case that a narrow reception beam provides the best quality link for the feeder terminals. However, in contrast, the feeder base station 200 will typically, by necessity, need to use a relatively wider reception beam width, in order to facilitate receiving communications from the multiple feeder terminals with which it communicates (the feeder base station taking part in a point-to-multipoint communication).

In this example, an interference source is assumed to arise due to a point to point communication between two wireless communication elements 215, 220 that are not part of the wireless network incorporating the feeder base station 200 and the feeder terminals 205, 210. As schematically shown, transmissions from the interference source element 215 are likely to be observed by the reception beam of feeder terminal 2 210, and it is possible also that such communications may also be observed by the reception beam of feeder terminal 1 205. Similarly, the feeder base station 200 is likely to observe in its reception beam communications from the interference source 2 220.

In one embodiment, the feeder terminals may be arranged to be able to adjust their beam pattern, and/or the azimuth direction of their antenna assemblies so as to prevent the interference sources being observed in their reception beams, or at least to significantly attenuate the signals from those interference sources.

Whilst the feeder base station 200 can also be arranged in one embodiment to adjust its reception beam patterns and/or its azimuth direction, the process of seeking to remove or significantly attenuate the effects of an interference source, such as that from element 220 shown in FIG. 9, is significantly complicated due to the point-to-multipoint nature of the communications, and in particular the desire for the feeder base station to maintain good quality links with the various feeder terminals 205, 210.

In accordance with one embodiment, a nulling test operation is provided that can be executed by the feeder base station 200 in order to seek to attenuate the effects of the interference source whilst seeking to maintain good quality links with the various feeder terminals. The nulling test operation of one embodiment is described with reference to the flow diagram of FIG. 10.

At step 230, it is determined whether a trigger for a reception beam nulling test operation has been received. There are a number of ways in which such a nulling test operation could be triggered. It may for example be scheduled to occur at predetermined intervals, or could be triggered by an observed drop in the quality of a link with at least one of the feeder terminals, as for example determined from measured signal to noise ratio values such as a CINR value. Alternatively, or in addition, it could be triggered by user action, for example a human operator in a network control centre. As a yet further alternative, the nulling test operation could effectively be repeated continuously, such that once a current nulling test operation has been performed in order to select a reception beam pattern to use, a next nulling test operation is thereafter initiated.

Once a trigger for a reception beam nulling test is detected at step 230, then at step 235 an initial reception beam test pattern is determined at step 235. The earlier discussed FIG. 7 gives some examples of various reception beam patterns that may be available. In one particular embodiment, there are actually 130 possible reception beam patterns, and during the nulling test operation at least a subset of those will be tested to determine which is considered to be the most appropriate to use for subsequent uplink communications with the feeder terminals. In one particular embodiment, each of the possible 130 test patterns is tested during the nulling test operation. The choice of which test pattern is chosen as the initial test pattern at step 235 can be arbitrary in one embodiment.

Once an initial test pattern has been chosen, then at step 240 that selected test pattern is applied, and hence the antenna assembly is controlled so as to employ that chosen reception beam pattern. That chosen reception beam test pattern is then maintained for a predetermined period of time. In one embodiment, it may be maintained for a single frame period during which a frame of information may be received from the feeder terminals.

At step 245, during that predetermined period of time in which the chosen test pattern is employed, quality metric determination circuitry within the feeder base station (which may for example be provided within the antenna controller 114 of FIG. 6) will observe certain properties of any communications received from the feeder terminals, for example measuring the CINR of any such communications, and based on those measurements will determine a link quality metric for each feeder terminal. This link quality metric can take a variety of forms, but in one embodiment is a throughput indication such as a spectral efficiency value.

There are a number of scenarios in which the nulling test operation may be performed. It could for example be implemented during a dedicated test operation where each of the feeder terminals is specifically scheduled to transmit a predetermined test sequence to the feeder base station, hence effectively forcing all of the feeder terminals to communicate during the predetermined period in which each test pattern is employed by the feeder base station. However, in an alternative embodiment the nulling test operation may be performed during normal operation of the wireless network, whilst live data traffic is being communicated. In that instance, it cannot be guaranteed that in any particular frame all of the feeder terminals will communicate with the feeder base station. Hence, whilst at step 245 it is desired to determine link quality metrics for all of the feeder terminals, it may not be possible to achieve that by merely employing each test pattern for a single frame. However, as will be discussed later with reference to steps 265 and 270, multiple sweeps through the various test patterns can be performed until it is determined that all of the feeder terminals have communicated at least once (or a desired number of times) with the feeder base station whilst the feeder base station is using each possible test pattern, so that link quality metrics have at that point been determined for all feeder terminals. Such a process could be subjected to a timeout condition, so that there is no potential for the process to continue indefinitely, and in the event of a timeout it would be appropriate to then set a predetermined link quality metric (effectively indicating zero link quality) for any feeder terminal/test pattern combination where no communication has yet been observed by the feeder base station.

Following elapse of the predetermined time period, such as the single frame mentioned earlier, step 245 progresses to step 250, which is an optional step. This optional step may for example be appropriate when the nulling test operation is performed during the normal use of the wireless network, where live data is being communicated. In particular, it could be the case that the chosen test pattern employed during the last frame provided an insufficient link quality for a particular feeder terminal to communicate data that it wished to communicate during that frame. This will typically cause the feeder terminal to retry during a subsequent frame, and it is desirable that for that subsequent frame a reception beam pattern is used that is likely to allow the communication to be successful. Hence, in one embodiment a reference pattern is maintained, which may for example be the last active reception beam pattern used prior to initiating the nulling test operation. Hence, following step 245, the antenna assembly can be arranged to revert to that reference pattern for a predetermined number of frames (typically multiple frames) so as to provide a predictable environment in which any required retry processes can be performed.

Whilst such an optional step is useful when the nulling test operation is being performed during normal operation of the wireless feeder network, it will be appreciated that in other embodiments it may not be used. For example, if the nulling test operation is performed during a specific test operation where each of the feeder terminals is forced to communicate with the feeder base station during the period in which each reception beam test pattern is used, then there may be no need to revert to such a reference pattern in between checking each reception beam test pattern.

At step 255, it is determined whether all of the possible reception beam test patterns have been tested. As mentioned earlier, in one embodiment the nulling test operation is performed for all 130 possible reception beam patterns, and accordingly at step 255, if not all of those reception beam patterns have been tested, the process will proceed to step 260, where the next reception beam test pattern is calculated, and thereafter that next reception beam test pattern is applied at step 240. Steps 245, 250 are then repeated in turn for each test pattern until it is determined at step 255 that all test patterns have been tested.

The process then proceeds to step 265, where it is determined whether there are any more pattern sweeps required. As mentioned earlier, it is desirable that during the nulling test operation at least one communication is observed from each feeder terminal for each test pattern. Hence, at step 265, if this condition has not been met, a value indicating the number of pattern sweeps performed can be incremented at step 270, and the process then returns to step 235 to perform a further sweep through the test patterns. During this process, it is possible that due to the multiple iterations of step 245, multiple link quality metrics are determined for a particular feeder terminal for a particular test pattern. In one embodiment, in this scenario sufficient information is kept to enable an average link quality metric to be determined for that particular feeder terminal and test pattern combination. For example, in one embodiment the various determined link quality metrics could be aggregated, and a value kept indicative of the number of link quality metrics determined for that particular FT/test pattern combination so that an average can later be determined.

Figure 10:
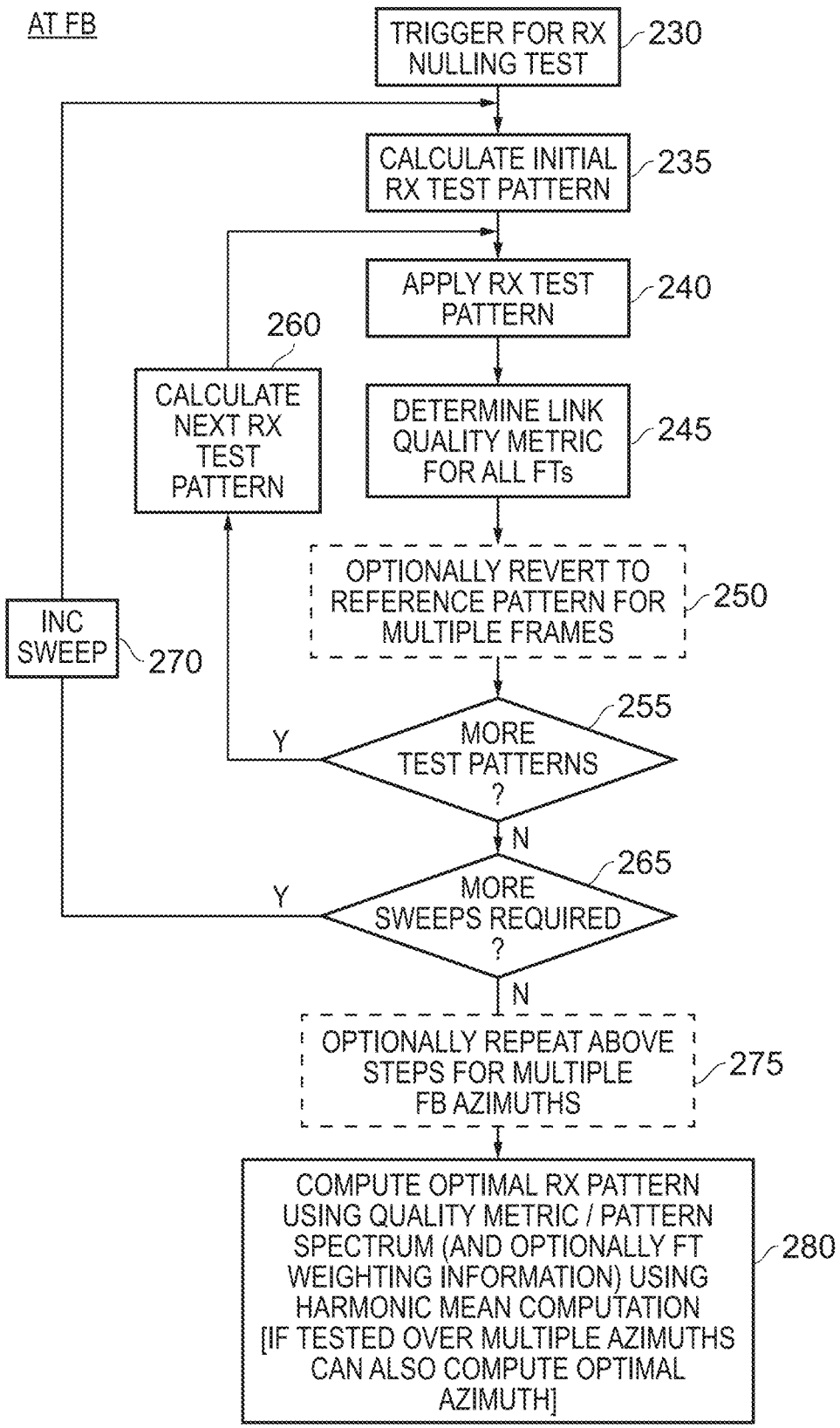
FIG. 10 is a flow diagram illustrating a nulling test operation that may be performed at a feeder base (also referred to herein as a feeder base station) in accordance with one embodiment in order to seek to reduce the effects of interference sources on the link quality.

In one embodiment, as shown in FIG. 10, if another sweep is required, that sweep is performed using all of the test patterns. In an alternative embodiment, it would be possible to modify the process, so that each subsequent sweep only employed the test patterns for which insufficient information has been obtained by virtue of any preceding pattern sweeps. This could improve the speed of operation of the nulling test operation.

Further, whilst in one embodiment it may be determined at step 265 that no more sweeps are required once at least one measurement has been observed for each feeder terminal for each test pattern, in an alternative embodiment it may be determined that multiple measurements are required for each of the feeder terminals for each test pattern, and this can be used merely to change the criteria for determining whether more sweeps are required. When multiple measurements are required, the link quality metrics can be aggregated and later averaged.

As another factor that may be taken into consideration when determining at step 265 whether more sweeps are required, a timeout condition could be evaluated. This could for example make reference to the value kept about the number of sweep patterns performed, and when the number of sweep patterns performed reaches a predetermined maximum value, it is determined that no more sweeps are to be performed, even if the desired amount of information as to the link quality for each feeder terminal for each test pattern has not yet been obtained. For any feeder terminal/test pattern combinations where an insufficient amount of information has been obtained, a predetermined link quality metric could be determined at that point for those combinations. For example, if no communication has been received from a particular FT for a particular test pattern by the time the timeout condition is reached, then a value could be provided for the link quality metric for that FT/test pattern combination (which may effectively indicate that a zero quality link has been observed).

The above described process is performed without any changes being made to the azimuth direction of the antenna assembly of the feeder base station. In one embodiment, it is indeed intended that the nulling test operation is performed independently of the azimuth direction of the antenna assembly, and accordingly it is assumed that the antenna assembly's azimuth will not be altered as a result of the nulling test operation, and instead the nulling test operation is aiming to achieve a most appropriate beam pattern to use having regards to the interference sources, and having regard to the current azimuth direction of the feeder base station's antenna assembly. However, as indicated by the dotted box 275 in FIG. 10, if desired, the entirety of the above described process could be repeated for each of multiple different possible azimuth directions of the antenna assembly. This would effectively result in multiple sets of results that could be then passed to the final processing step 280.

Figure 11:
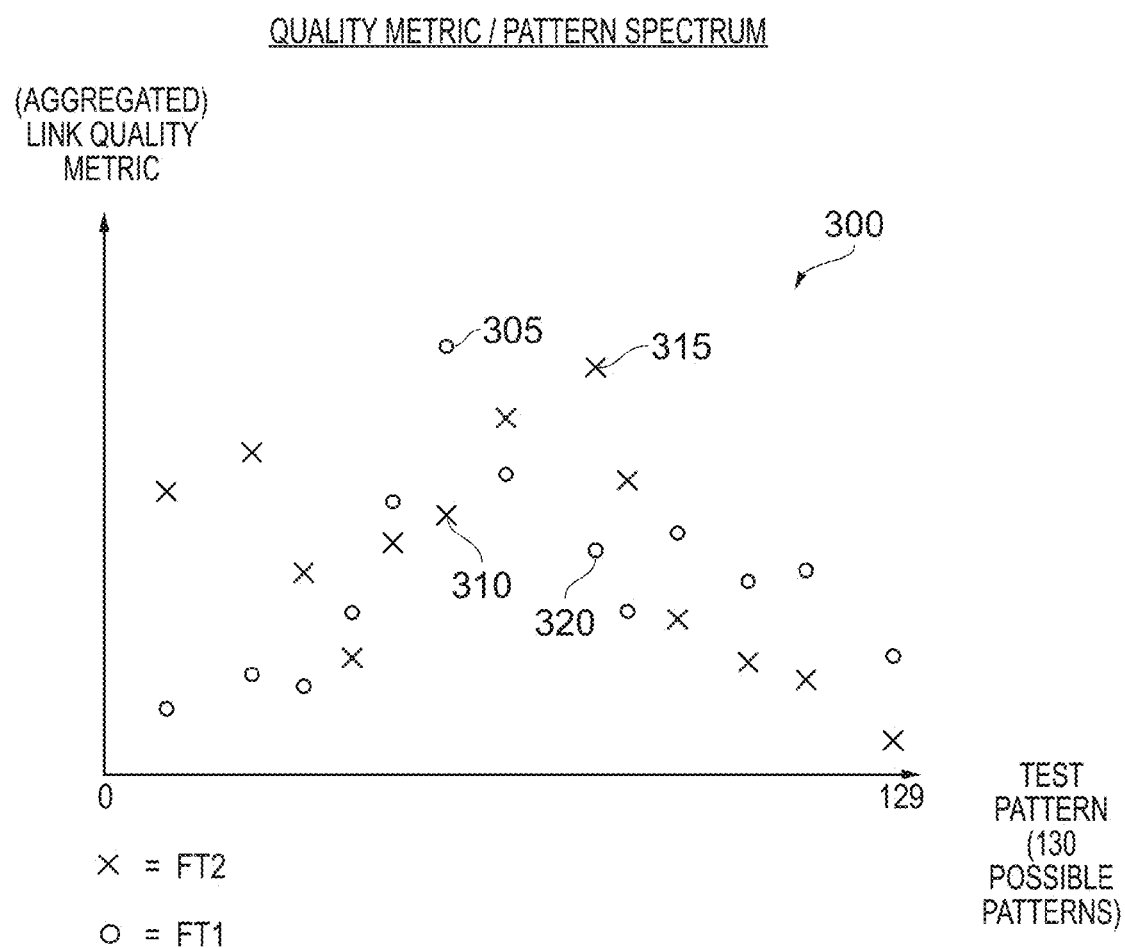
FIG. 11 schematically illustrates a link quality metric/pattern spectrum that is determined during the nulling test operation illustrated in FIG. 10.

Each individual set of results will be referred to herein as a quality metric/pattern spectrum, an example of which is illustrated schematically in FIG. 11 for a scenario where the feeder base station is communicating with two feeder terminals. This spectrum evaluates the quality metric of each feeder terminal at each possible test pattern. As mentioned earlier with reference to FIG. 10, if, for any particular combination of pattern and feeder terminal, multiple link quality metrics are determined, then in one embodiment those can be aggregated, in which event the spectrum will include the aggregated quality metric for each test pattern, and as mentioned earlier sufficient information will typically be maintained about the number of link quality metrics observed in order to enable an average link quality metric to be determined.

FIG. 11 shows the link quality metric/pattern spectrum obtained as a result of performing steps 235 through 270. If those steps are repeated for multiple different feeder base station azimuth directions, then it will be appreciated that multiple sets of quality metrics/pattern spectrums will be obtained.

As can be seen from the example of FIG. 11, it is often the case that a particular test pattern that gives a good link quality metric for one feeder terminal may not do so for another. This is evident for example from a comparison of point 305, which appears to indicate the test pattern which gives the best link quality for the feeder terminal FT1, with the point 310 indicating the link quality metric when using the same test pattern, but this time for the feeder terminal FT2. Similarly, the value 315 associated with FT2 is in connection with a test pattern where a significantly reduced link quality metric 320 is observed for FT1. Accordingly, it will be appreciated that the process of determining a suitable test pattern to use for subsequent communications is complicated by the presence of multiple feeder terminals, and in particular the requirement for the feeder base station to chose a reception beam pattern that facilitates reception of communications from those multiple feeder terminals.

Returning to FIG. 10, at step 280 a process is hence invoked to seek to compute an optimal receive beam pattern based on the link quality metric/pattern spectrum data obtained as a result of the earlier described process. As mentioned earlier, if tested over multiple azimuth directions, there will actually be multiple link quality metric/pattern spectrums input at this point.

In one embodiment, reception beam determination circuitry (which may for example be provided within the antenna controller 114) is used to perform a harmonic mean computation at step 280 using the link quality metric/pattern spectrum in order to determine an optimal receive beam pattern to use. Optionally, the reception beam determination circuitry may also receive other input to take into account when performing this harmonic mean computation. For example, it may receive weighting information associated with the various feeder terminals, this information effectively providing relative weightings for the individual feeder terminals. This is useful for example where different feeder terminals have different levels of service associated with them, and accordingly it is very useful to take that level of service into account when deciding on suitable reception beam patterns. This would for example indicate situations where certain feeder terminals require a higher quality link than others in accordance with their agreed level of service. In such embodiments where weighting information is provided, then a weighted harmonic mean computation can be performed to take that additional information into account.

As mentioned earlier, if the process is also repeated at step 275 for multiple azimuth directions, then the computation at step 280 can be further adjusted so as to choose an optimal combination of azimuth direction and reception beam pattern to use for subsequent communication.

Figure 12:
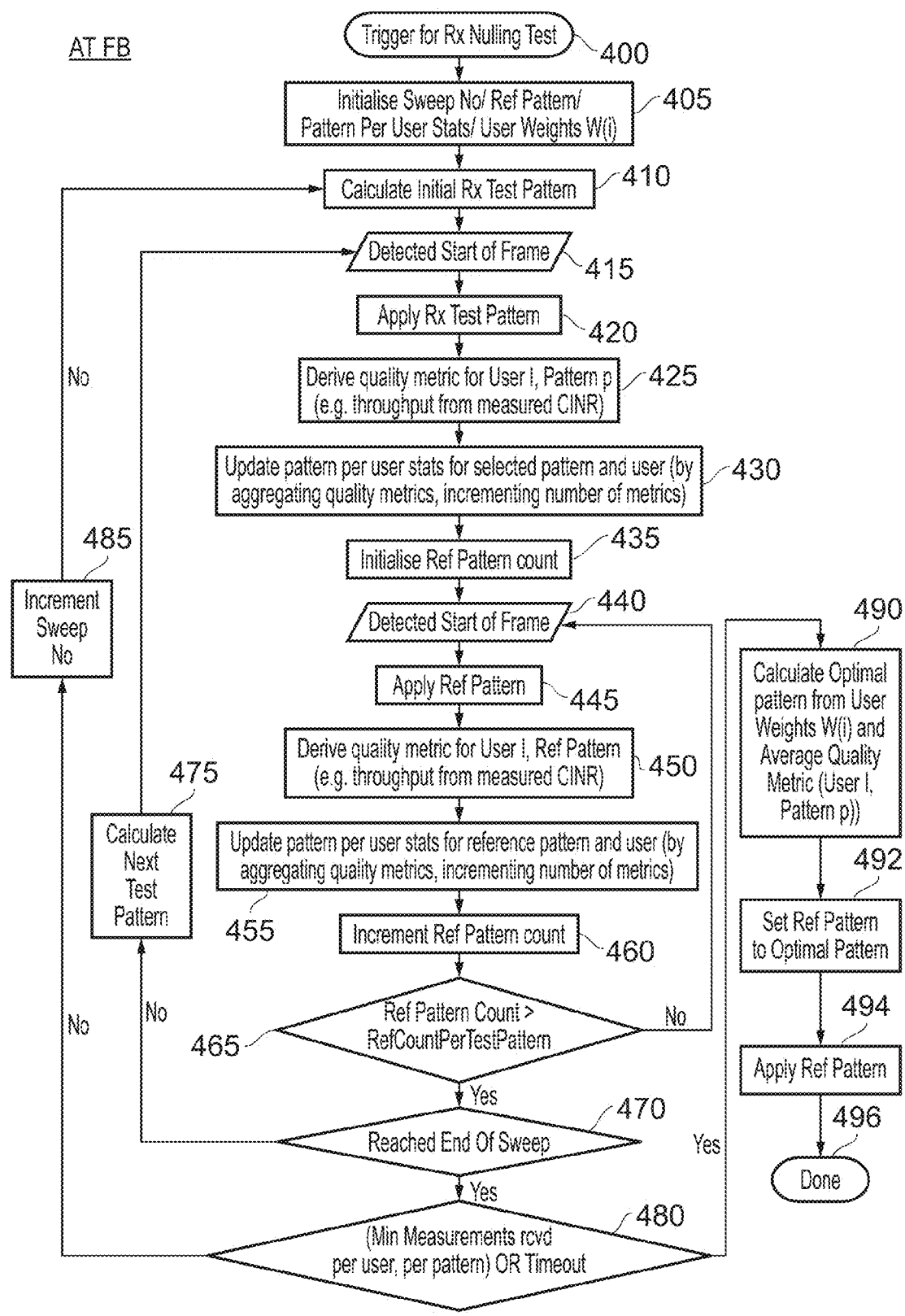
FIG. 12 is a flow diagram providing a more detailed illustration of one particular embodiment of the approach outlined in FIG. 10.

FIG. 12 illustrates in more detail one particular implementation of the process discussed with reference to FIG. 10. At step 400, it is determined whether a trigger for performing the reception beam nulling test operation has been detected. If so, at step 405 a certain number of parameters are initialised. In particular, a sweep number is initialised to zero, a reference pattern is set equal to the reception beam pattern being used prior to the nulling test operation being triggered, and pattern per user stats are initialised to zero. Further, if any user weighting information is provided, those user weighting values are set at this point.

At step 410 an initial reception beam test pattern is calculated and then on detection of a start of a frame at step 415, that selected test pattern is applied to the receiver of the feeder base station at step 420.

At step 425, the link quality metrics are determined for each user, and for the currently selected beam pattern. As mentioned earlier, this could for example be determined by computing a throughput from the measured CINR. At step 430, the pattern per user stats are then updated for the selected pattern and user. In this example embodiment, it is assumed that the process is performed during live data communication, and that accordingly multiple sweeps may be required, and hence multiple link quality metrics may be observed over time at step 430 for a particular user and a particular pattern. As mentioned earlier, in one embodiment, these multiple determined link quality metrics can be maintained by aggregating the link quality metrics and incrementing the number of metrics so as to keep track of how many metrics have been aggregated.

At the end of the frame, a reference pattern count is initialised at step 435, and then once the next frame has been detected at step 440, the reference pattern is applied at step 445. At this point, the antenna assembly will now be employing the reference pattern, which as mentioned earlier is the last reception beam pattern that was being used prior to the nulling test operation being triggered. At step 450, link quality metrics can then be derived for each user for that reference pattern in much the same way as step 425 for the test pattern. Then at step 455 the pattern per user stats for the reference pattern can be updated in much the same way as discussed earlier at step 430 with respect to the test pattern. At step 460 the reference pattern count is incremented at the end of the current frame, and then at step 465 it is determined whether the reference pattern count is greater than a reference count per test pattern value, indicating the number of frames that the reference pattern should be used for in between each test pattern. If it is not, then the process returns to step 440, whereas otherwise the process proceeds to step 470.

Accordingly, by virtue of the steps 440-465, it will be appreciated that the reference pattern is used for multiple frames between each test pattern being tested for a single frame. As mentioned earlier, this provides stability when performing the nulling test operation during normal use of the wireless network, as it continues to allow real data to be transmitted from the FTs to the base station irrespective of the suitability of the individual test patterns being employed.

At step 470 it is determined whether the end of the sweep has been reached, and if not the next test pattern is calculated at step 475 and the process returns to step 415.

Once the end of the sweep has been detected at step 470, then at step 480 it is determined whether the minimum amount of measurements have been received per user and per pattern, or whether the timeout condition has been reached. If not, then the sweep number is incremented at step 485 and the process returns to step 410.

Once it is determined that the minimum number of measurements have been received per user and per pattern, or the timeout condition is detected, the process proceeds to step 490 where the optimal beam pattern is calculated from the user weights information (if provided), and from the average quality metric observed for each user and each pattern. In this example, it is assumed that the azimuth direction of the feeder base station is not changed, and accordingly will not be affected by the nulling test operation. However, if as discussed with reference to FIG. 10 it is desired to also test for each azimuth direction, then the adjustment of the azimuth can be performed as an outer loop between steps 480 and 490, where for each different selected azimuth direction the process then returns to step 405 to re-perform the entire process and produce another set of link quality metrics/pattern data. Then at step 490 an optimal combination of beam pattern and azimuth is determined.

As mentioned earlier, in one embodiment step 490 is performed by implementing a weighted harmonic mean computation which will be discussed in more detail later. Once the computation has been performed then the reference pattern is set equal to the calculated optimal pattern at step 492 and thereafter the reference pattern is applied at step 494, at which point the process completes at step 496. Hence, the computed optimal pattern becomes the new reference pattern, which will then be used as the reference pattern for a subsequent nulling test operation. If the test incorporates multiple azimuth directions, an azimuth direction is also selected and applied at steps 492/494.

Figure 13A:
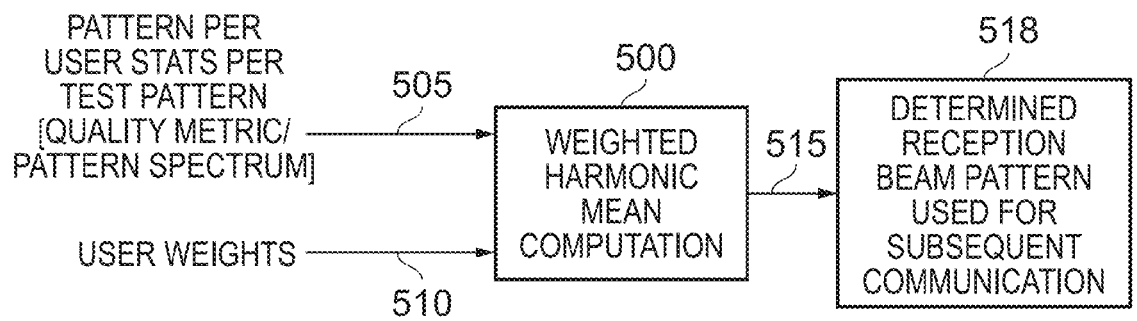
FIGS. 13A and 13B schematically illustrate the computation performed in the final step of FIG. 10 in accordance with two different embodiments.

FIG. 13A schematically illustrates the inputs and outputs of the weighted harmonic mean computation in one embodiment. In particular, the weighted harmonic mean computation 500 receives the pattern stats per test pattern and per user over path 505, these pattern stats also being referred to herein as a quality metric/pattern spectrum, as for example illustrated schematically in FIG. 11. Also, the weights per user are input over path 510. As a result of using those inputs within the weighted harmonic mean computation, a reception beam pattern is determined as indicated by the output over path 515, and that determined reception beam pattern is then used for subsequent communications as indicated by the box 518.

Figure 13B:
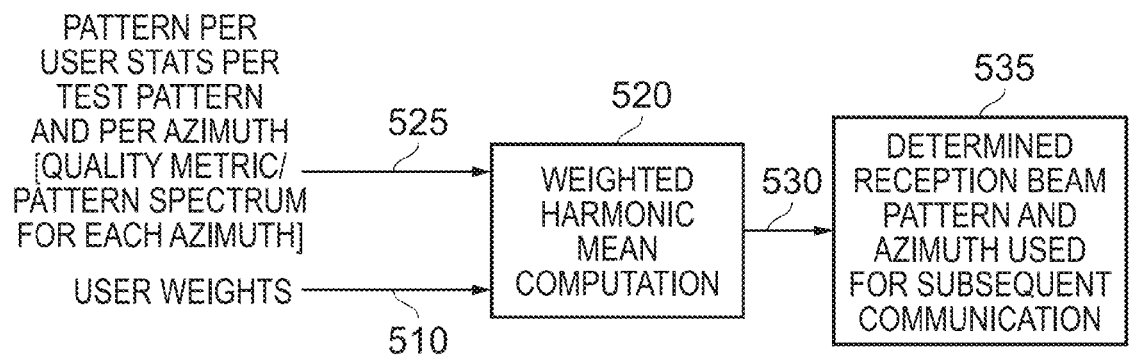

FIG. 13B is a similar figure but for an embodiment where the azimuth direction is also changed. Hence, the inputs over path 525 are, for each selected azimuth direction, the pattern stats per test pattern and per user, and hence over path 525 the process will receive a quality metric/pattern spectrum for each selected azimuth direction. Again the weights per user will be input over path 510. Over path 535, an indication of the computed optimal combination of azimuth direction and reception beam pattern will be output, which will then be used for subsequent communication as indicated by the box 535.

Figure 14:
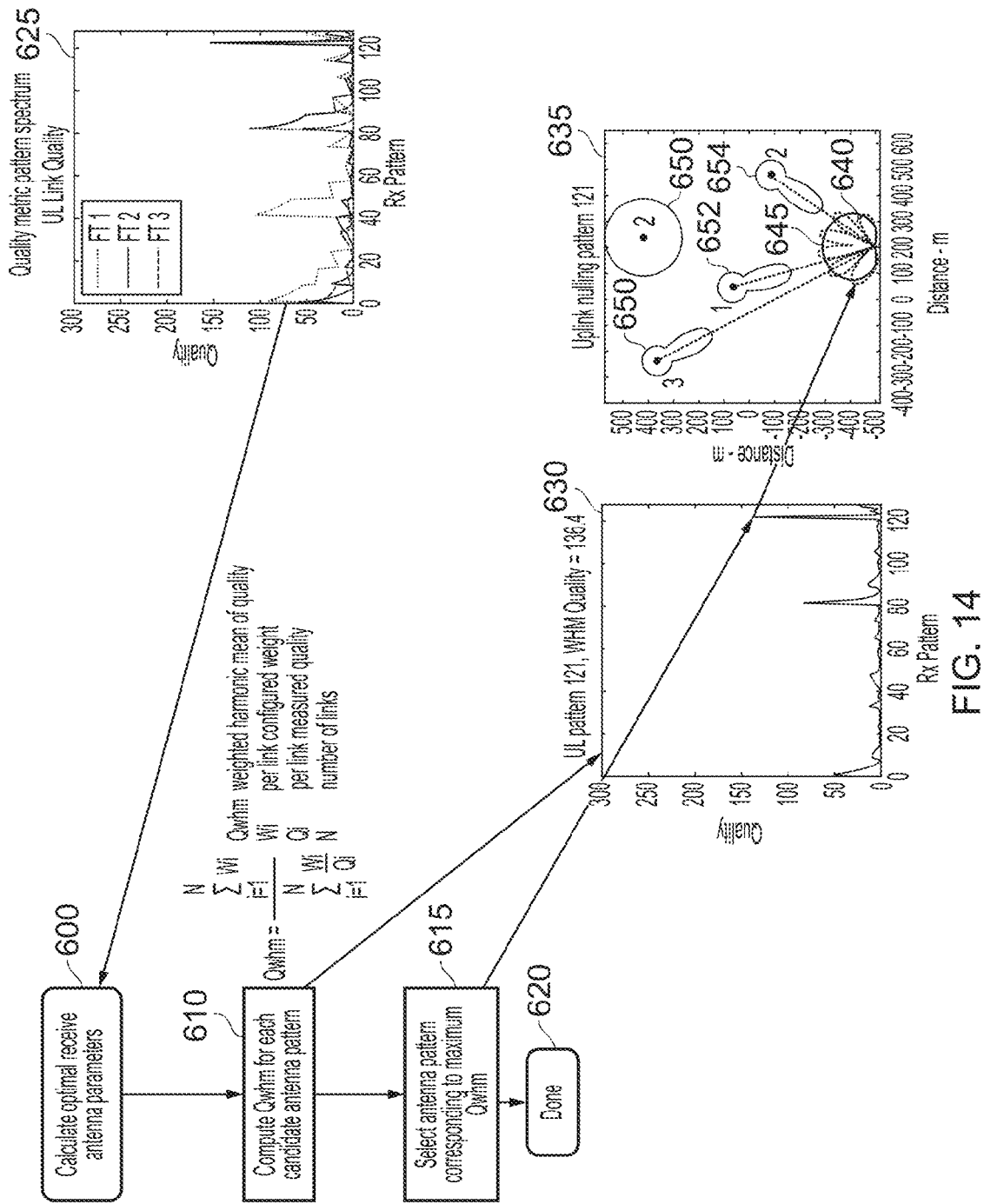
FIG. 14 is a flow diagram illustrating in more detail the weighted harmonic mean throughput computation in accordance with one embodiment.

FIG. 14 is a flow diagram illustrating in more detail the performance of the weighted harmonic mean throughput computation in accordance with one embodiment, in this example it being assumed that the approach of FIG. 13A is adopted, and accordingly a single quality metric/pattern spectrum has been determined. At step 600, it is determined that the process is ready to calculate the optimal receive antenna parameters, this being the case when step 280 of FIG. 10, or step 490 of FIG. 12, is reached.

At this point, the quality metric/pattern spectrum is available, and may for example take the form shown by the graph 625. As discussed earlier with reference to FIG. 11, this graph effectively provides a plot of link quality against test pattern for each of the feeder terminals.

The process then proceeds to step 610, where a weighted harmonic mean operation is performed using the equation shown to the right-hand side of step 610 in FIG. 14. In particular, the weighted harmonic mean of quality (Qwhm) is determined for each candidate antenna reception beam pattern using the quality metric/pattern spectrum, and any provided weighting information for the various feeder terminals. This results in the generation of an output such as shown by way of example with reference to the graph 630 of FIG. 14. As can be seen from FIG. 14, the output of this computation provides a plot of quality against reception beam pattern having taken into account the individual plots for each of the feeder terminals, and the weighting information for the feeder terminals.

Following step 610, then at step 615 the antenna reception beam pattern is selected that corresponds to the maximum Qwhm value. In this example, reception beam pattern 121 is chosen for the base station, which is shown in the diagram 635 by the dotted pattern 640. The solid pattern 645 represents the transmission beam pattern employed by the base station in this particular example. The patterns 650, 652, 654 represent the transmission and reception beam patterns used by the various feeder terminals. The circle 650 represents an omnidirectional source of interference. As will be appreciated from the diagram 635, when considering the base station's view of that source of interference, a null in the reception beam pattern 640 is presented in the direction of that interference source 650, hence significantly attenuating the effect of that interference source as observed at the base station.

If the approach of FIG. 13B is instead adopted, and accordingly there are multiple quality metric/pattern spectrums available, for different azimuth directions, then the process of FIG. 14 can be adapted as follows. In particular, step 610 can be repeated for each azimuth direction, using the associated quality metric/pattern spectrum. The results from each iteration of step 610 can then be overlaid within the graph 630. Then at step 615 the maximum Qwhm value is detected, and the reception beam pattern and azimuth associated with that maximum value is then determined. The receive antenna within the base station can then be arranged to adopt that determined azimuth direction, and the determined reception beam pattern, for subsequent communications with the feeder terminals.

Figure 15:
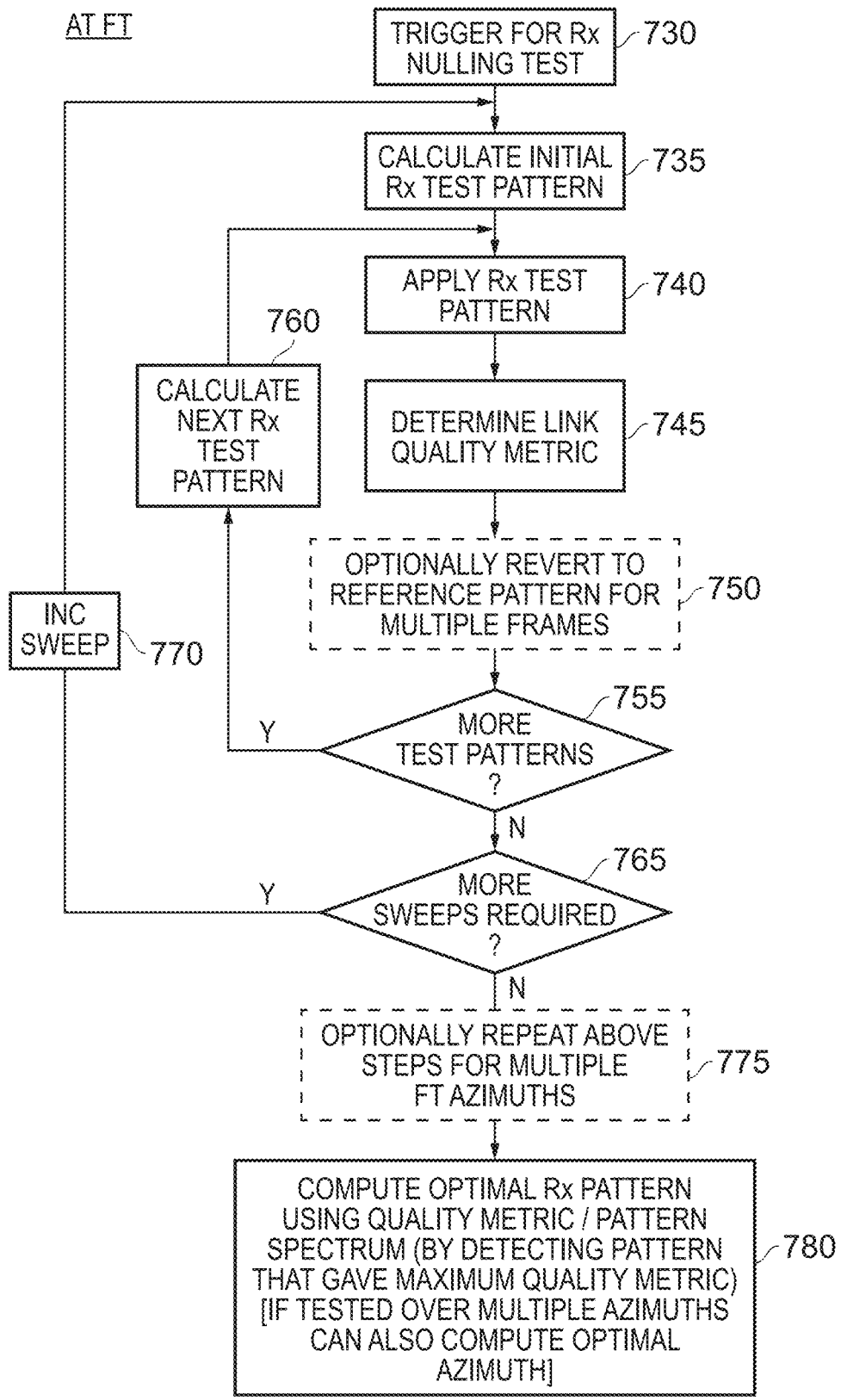
FIG. 15 is a flow diagram schematically illustrating how the process of FIG. 10 may be modified in order to enable that process to also be performed at individual feeder terminals in accordance with one embodiment.

The above described nulling test operation has been described with reference to the steps taken within a feeder base station. FIG. 15 illustrates how a simplified version of the process could also be implemented within a feeder terminal if required. From a comparison of FIG. 15 with the earlier described FIG. 10, it will be appreciated that the "700" series of reference numbers correspond generally with the "200" series of reference numerals used in FIG. 10. However, step 745 differs slightly from step 245, in that only a single link quality metric needs to be determined for each test pattern, namely for a downlink communication from the feeder base station to that feeder terminal. Again, if used during live network traffic, the optional step 750 could be used so that the reception beam at the feeder terminal reverts to a reference pattern for multiple frames between each tested reception beam, so as to ensure that any communication that the feeder base station did send whilst using the test pattern applied at step 740 (and which may not have been received due to the inappropriate nature of that test pattern) can now be received. At step 775, if the feeder terminal has a mechanically rotatable antenna assembly as per the embodiments described earlier, then if desired the process of the preceding part of FIG. 15 could be repeated for each of multiple selected feeder terminal azimuth directions.

Step 780 is then less complex than the equivalent step 280 of FIG. 10, since it will be appreciated that the quality metric/pattern spectrum developed during the process of FIG. 15 only relates to a single feeder terminal. Hence, in one embodiment all that is required is to detect the test pattern that gave the maximum link quality metric (or maximum average link quality metric if multiple link quality metrics have been observed). If tested over multiple azimuths, then that computation can also be modified so as to select the particular test pattern and azimuth combination that gave the maximum link quality metric (or maximum average link quality metric).

As mentioned earlier, the above described nulling test operation can be performed in a wide variety of different deployments, and is not restricted to the particular design of feeder base station described earlier. However, by way of illustration, it provides a particularly efficient mechanism for controlling the earlier described feeder base station. In particular, as discussed for example with reference to FIG. 5, in accordance with that embodiment beamforming is performed at the RF stage (i.e. at the radio stage), rather than at the baseband stage (i.e. at the digital signal processing stage) which would be the stage to the right of the components shown in FIG. 5 that receives the pair of reception signals produced by the components shown in FIG. 5. The above described nulling test operation can be implemented by the antenna controller 114 in order to produce suitable receiver patterns that the front end control circuitry 116 can then cause the elements 118 to employ through appropriate switch, attenuator and phase shift control. As mentioned earlier, the block 118 in FIG. 6 effectively represents all of the components in FIG. 5 other than the antenna array components.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

The invention claimed is:

1. Antenna apparatus for operating as a base station in a wireless network, comprising:
    an antenna assembly to employ a reception beam pattern selected from a plurality of reception beam patterns;
    a reception beam pattern controller to cause the antenna assembly to employ each of said plurality of reception beam patterns during a nulling test operation;
    quality metric determination circuitry to determine, for each reception beam pattern employed during said nulling test operation, a link quality metric for each of a plurality of wireless terminals based on communication between the plurality of wireless terminals and the base station whilst the antenna assembly is employing that reception beam pattern; and
    reception beam determination circuitry to determine, from the link quality metrics determined for the plurality of wireless terminals for each of the plurality of reception beam patterns, a reception beam pattern from said plurality of reception beam patterns to be used for a subsequent communication with the plurality of wireless terminals.

2. The antenna apparatus as claimed in claim 1, wherein the reception beam determination circuitry is arranged to receive weighting information associated with at least one wireless terminal, and is arranged to utilise the weighting information in combination with the link quality metrics when determining the reception beam pattern to be used for the subsequent communication.

3. The antenna apparatus as claimed in claim 2, wherein the weighting information is indicative of a level of service to be provided to at least one of the wireless terminals.

4. The antenna apparatus as claimed in claim 1, wherein the reception beam determination circuitry is configured to perform a harmonic mean operation using as inputs the link quality metrics determined for the plurality of wireless terminals for each of the plurality of reception beam patterns, in order to determine the reception beam pattern to be used for the subsequent communication.

5. The antenna apparatus as claimed in claim 4, wherein the reception beam determination circuitry is arranged to receive weighting information associated with at least one wireless terminal, and is arranged to utilise the weighting information in combination with the link quality metrics when determining the reception beam pattern to be used for the subsequent communication, wherein the harmonic mean operation is a weighted harmonic mean operation and the reception beam determination circuitry utilises the weighting information as a further input to the weighted harmonic mean operation.

6. The antenna apparatus as claimed in claim 1, wherein the link quality metric is a throughput indication for the associated wireless terminal.

7. The antenna apparatus as claimed in claim 1, wherein the nulling test operation is continued until communication is observed by the base station from each of the plurality of wireless terminals for each of the plurality of reception beam patterns.

8. The antenna apparatus as claimed in claim 7, wherein:
    the reception beam pattern controller is arranged to perform one or more pattern sweeps, during each pattern sweep one or more of the plurality of reception beam patterns being employed for a predetermined time period;
    following the end of a current pattern sweep, a subsequent pattern sweep being performed if communication has not yet been observed from at least one wireless terminal for at least one reception beam pattern.

9. The antenna apparatus as claimed in claim 8, wherein when performance of multiple pattern sweeps causes communication between a wireless terminal and the base station to be observed by the base station multiple times whilst the antenna assembly is employing a particular reception beam pattern, the quality metric determination circuitry is configured to maintain information to enable an average link quality metric to be determined for that wireless terminal at that particular reception beam pattern.

10. The antenna apparatus as claimed in claim 7, wherein:
    the reception beam pattern controller is arranged to terminate the nulling test operation on detection of a timeout condition; and
    the quality metric determination circuitry is arranged, for each reception beam pattern, to allocate a default link quality metric value for any wireless terminal from which communication has not yet been observed for that reception beam pattern by a time the nulling test operation is terminated.

11. The antenna apparatus as claimed in claim 7, wherein during the nulling test operation, each of the wireless terminals is scheduled to communicate with the base station during a period in which each reception beam pattern is employed.

12. The antenna apparatus as claimed in claim 1, wherein the nulling test operation is performed whilst the base station and the plurality of wireless terminals are operating to communicate normal data traffic.

13. The antenna apparatus as claimed in claim 12, wherein:
    the reception beam pattern controller is arranged, during the nulling test operation, to cause the antenna assembly to employ a reference reception beam pattern for a period of time between each of said plurality of reception beam patterns being employed.

14. The antenna apparatus as claimed in claim 1, wherein the nulling test is performed whilst the base station and the plurality of wireless terminals are operating in a test mode where the wireless terminals are arranged to issue test traffic to the base station.

15. The antenna apparatus as claimed in claim 1, wherein the antenna assembly is a rotatable antenna assembly and the antenna apparatus further comprises:
    a rotation controller to rotate the rotatable antenna assembly in order to alter an azimuth direction of the rotatable antenna assembly;
    wherein:
    the rotation controller is configured, during the nulling test operation, to perform a rotation sweep operation in order to rotate the rotatable antenna assembly to each of multiple selected azimuth directions, the reception beam pattern controller being arranged to cause each of the plurality of reception beam patterns to be employed at least once at each selected azimuth direction;

the quality metric determination circuitry is configured to determine the link quality metric for each wireless terminal, for each reception beam pattern at each selected azimuth direction; and the reception beam determination circuitry is arranged to determine both the reception beam pattern to be used for the subsequent communication and an azimuth direction at which the antenna assembly is to be positioned for that subsequent communication.

16. The antenna apparatus as claimed in claim 1, wherein the link quality metric relates to an uplink communication from the associated wireless terminal to the base station.

17. The antenna apparatus as claimed in claim 1, wherein the wireless network is a wireless backhaul network for coupling a core network to a wireless access network, and the base station is a feeder base station for connection to the core network.

18. The antenna apparatus as claimed in claim 17, wherein at least one of the wireless terminals is a feeder terminal for connection to an access point of the wireless access network.

19. A method of performing spatial nulling in an antenna apparatus to operate as a base station in a wireless network, the antenna apparatus having an antenna assembly to employ a reception beam pattern selected from a plurality of reception beam patterns, the method comprising:

controlling the antenna assembly, during performance of a nulling test operation, to employ each of said plurality of reception beam patterns;

determining, for each reception beam pattern employed during said nulling test operation, a link quality metric for each of a plurality of wireless terminals based on communication between the plurality of wireless terminals and the base station whilst the antenna assembly is employing that reception beam pattern; and determining, from the link quality metrics determined for the plurality of wireless terminals for each of the plurality of reception beam patterns, a reception beam pattern from said plurality of reception beam patterns to be used for a subsequent communication with the plurality of wireless terminals.

20. Antenna apparatus for operating as a base station in a wireless network, comprising:

antenna means for employing a reception beam pattern selected from a plurality of reception beam patterns;

reception beam pattern control means for controlling the antenna means to employ each of said plurality of reception beam patterns during a nulling test operation;

quality metric determination means for determining, for each reception beam pattern employed during said nulling test operation, a link quality metric for each of a plurality of wireless terminal means based on communication between the plurality of wireless terminal means and the base station whilst the antenna means is employing that reception beam pattern; and reception beam determination means for determining, from the link quality metrics determined for the plurality of wireless terminal means for each of the plurality of reception beam patterns, a reception beam pattern from said plurality of reception beam patterns to be used for a subsequent communication with the plurality of wireless terminal means.

* * * * *